United States Patent
Berg et al.

(10) Patent No.: US 11,329,668 B2
(45) Date of Patent: May 10, 2022

(54) METHODS, DECODER AND ENCODER FOR HANDLING A DATA STREAM FOR TRANSMISSION BETWEEN A REMOTE UNIT AND A BASE UNIT OF A BASE STATION SYSTEM

(71) Applicant: Telefonaktiebolaget LM Ericsson (publ), Stockholm (SE)

(72) Inventors: Miguel Berg, Sollentuna (SE); Chenguang Lu, Sollentuna (SE); Per Ola Börjesson, Lund (SE); Daniel Cederholm, Sollentuna (SE); Elmar Trojer, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 148 days.

(21) Appl. No.: 16/954,963

(22) PCT Filed: Dec. 20, 2017

(86) PCT No.: PCT/SE2017/051302
§ 371 (c)(1),
(2) Date: Jun. 17, 2020

(87) PCT Pub. No.: WO2019/125241
PCT Pub. Date: Jun. 27, 2019

(65) Prior Publication Data
US 2020/0313692 A1    Oct. 1, 2020

(51) Int. Cl.
*H04N 19/126* (2014.01)
*H03M 7/30* (2006.01)
(Continued)

(52) U.S. Cl.
CPC ........ *H03M 7/6041* (2013.01); *H04L 1/0014* (2013.01); *H04L 25/4927* (2013.01);
(Continued)

(58) Field of Classification Search
CPC .... H04N 19/126; H04N 19/136; H04N 19/13; H04N 19/46; H04N 19/70; H04N 19/61;
(Continued)

(56) References Cited

FOREIGN PATENT DOCUMENTS

| WO | 2011/162723 A1 | 12/2011 |
| WO | 2017204704 A1 | 11/2017 |

OTHER PUBLICATIONS

Examination Report, IN App. No. 202017019531, dated Jun. 2, 2021, 6 pages.
(Continued)

*Primary Examiner* — Eva Y Puente
(74) *Attorney, Agent, or Firm* — NDWE LLP

(57) ABSTRACT

A method performed by an encoder of a base station system, for handling a data stream for transmission over a transmission connection between a remote unit and a base unit of the base station system, the remote unit being arranged to transmit wireless signals to, and receive from, mobile stations. The method comprises quantizing a plurality of IQ samples, converting the quantized plurality of IQ samples to IQ predictions, calculating per sample a difference between the quantized plurality of IQ samples and the IQ predictions in order to create IQ prediction errors. The method further comprises quantizing the IQ predictions or the IQ prediction errors, entropy encoding the IQ prediction errors and sending the entropy encoded IQ prediction errors over the transmission connection to a decoder of the base station system. The method can be performed by a decoder.

20 Claims, 7 Drawing Sheets

(51) Int. Cl.
  *H04L 1/00* (2006.01)
  *H04L 25/49* (2006.01)
  *H04L 27/36* (2006.01)
  *H04L 27/38* (2006.01)

(52) U.S. Cl.
  CPC ........ *H04L 27/364* (2013.01); *H04L 27/3863* (2013.01); *H04N 19/126* (2014.11)

(58) Field of Classification Search
  CPC ...... H04N 19/40; H04N 19/124; H04N 19/14; H04N 19/60; H04N 19/103; H04N 19/12; H04N 19/176; G06T 9/00; G06T 9/001; G06T 9/40; G06T 3/40; G06T 5/006; G06T 17/10; G06T 17/205; G06T 7/75; G06T 9/005; H03M 7/30; H03M 7/40; H03M 1/0854; H03M 3/042
  USPC .......................................... 375/240; 704/500
  See application file for complete search history.

(56) References Cited

OTHER PUBLICATIONS

International Preliminary Report on Patentability, PCT App. No. PCT/SE2017/051302, dated Jul. 2, 2020, 8 pages.
International Search Report and Written Opinion for International Application No. PCT/SE2017/051302, dated Sep. 17, 2018, 11 pages.
Kruger et al., "A Partial Decorrelation Scheme for Improved Predictive Open Loop Quantization with Noise Shaping," Sep. 4-8, 2005, pp. 2713-2716, Proceedings of INTERSPEECH 2005, Lisbon, Portugal.
Ramalho et al., "An LPC-based Fronthaul Compression Scheme," Feb. 2017, pp. 318-321, IEEE Communications Letters, vol. 21, No. 2.
Chen et al., "A Linear Predictive Coding Based Compression Algorithm for Fronthaul Link in C-RAN," 6 pages, 2017 IEEE/CIC International Conference on Communications in China (ICCC).

METHODS, DECODER AND ENCODER FOR HANDLING A DATA STREAM FOR TRANSMISSION BETWEEN A REMOTE UNIT AND A BASE UNIT OF A BASE STATION SYSTEM

CROSS-REFERENCE TO RELATED APPLICATIONS

This application is a National stage of International Application No. PCT/SE2017/051302, filed Dec. 20, 2017, which is hereby incorporated by reference.

TECHNICAL FIELD

The present disclosure relates generally to methods, encoders and decoders of base station systems of a wireless communication network, for handling a data stream for transmission over a transmission connection between a remote unit and a base unit of the base station system, the remote unit being arranged to transmit wireless signals to, and receive from, mobile stations. The disclosure further relates to computer programs to be run in encoders and decoders and carriers containing such computer programs.

BACKGROUND

There are today different concepts for distributing base station functionality onto different nodes into a so called base station system, also called distributed base station system. Purposes for distributing base station functionality are to improve radio coverage and to increase throughput to User Equipments, UEs, also called mobile stations, as well as to decrease power consumption, decrease costs for base station systems and to improve coordination. In a distributed base station system, base station functionality is typically distributed onto one or more base units and a plurality of remote units connected to a base unit via a transmission link that may be a copper link, a fiber link or a microwave link, for example. The remote units may alternatively be called remote radio heads, RRH, or remote radio units, RRU. The transmission link in such a base station system may be called a fronthaul link. Typically, the remote unit is responsible for transmitting and receiving signals wirelessly from/to mobile stations via one or more antennas. The remote unit has simple functionality and can be made cheap and small, and the more intelligent functionality of a base station is moved to the base unit. Thereby, it may be cost-efficient for an operator to have many remote units, each remote unit being arranged close to its antenna covering a small geographical coverage area each, and to connect the remote units via a fronthaul link to a base unit. Further, a distributed base station may be cost-efficient as the base units, which are processing-heavy are centralized and can therefore share electrical power, cooling systems, processors etc. Also, to centralize base stations allows for co-ordination of traffic, e.g. mobility management, over a large coverage area. There are also variants of base station systems comprising an intermediate unit connected between the remote unit and the base unit. In such systems, the fronthaul is often referred to as the connection between the intermediate unit and the remote unit.

The distributed base station system is one of the key enablers for centralized radio access network, C-RAN, to further increase network capacity, reduce the cost and energy consumption. One of the main obstacles for deploying base station system solution is the high-speed transport requirement over the fronthaul, which may require deploying a lot of high-speed links, e.g. with fiber and high quality copper cables, per base station system. This will increase the transport cost dramatically, which may jeopardize even the feasibility of the C-RAN concept, especially for 5G using very high bandwidth.

FIG. 1 shows a basic block diagram of a prior art base station system comprising a base unit 130, a remote unit 120 connected to the base unit via a fronthaul link 125, and an antenna 110 connected to the remote unit 120. In downlink, DL communication, a baseband processing unit 132 of the base unit produces DL a complex baseband data stream in the format of IQ samples. Then the IQ samples are encapsulated by a fronthaul processing unit 134 according to a specific FH protocol, e.g. Common Public Radio Interface, CPRI, and transported over the fronthaul link 125 to the remote unit 120. At the remote unit 120, the IQ samples are de-capsulated and extracted by a fronthaul processing unit 122. Thereafter, the IQ samples are converted to an analog signal in a digital to analog converter, DA, 124 and transformed to a radio frequency, RF signal in an RF front end 126, which RF-signal is sent out from the antenna 110. In the uplink, the process is the opposite. Depending on the functional split between base unit and remote unit, the remote unit might also contain other functions such as Digital Front End and OFDM modulation/demodulation, which otherwise are at the base unit. When CPRI is used, OFDM modulation/demodulation is typically placed in the base unit.

Regarding the IQ sample bit rate, a single 20 MHz Long Term Evolution, LTE, antenna carrier with 30.72 MHz sampling rate and 30 bits per IQ sample (15 bits I and 15 bits Q) requires approximately 922 Mbps, without operation and management (OAM) signaling and line coding, though the traffic peak rate is only 100 Mbps (using 256 QAM modulation). Hence, the fronthaul link needs to carry more than 9 times the air-interface peak rate. Therefore, the capacity of the fronthaul link may become a bottleneck in terms of transmission capacity. The fronthaul problem is important and challenging and has become a hot area in the industry.

To mitigate the high bit-rate requirement over the fronthaul, various data compression schemes have been used. Data compression can be lossless, e.g. compression using entropy coding, or lossy, e.g. change of sample rate and/or quantization. In the scientific literature, there are several studies on IQ sample compression. Examples include resampling to lower bit rate together with re-quantization of samples with fewer bits, and also block scaling for each block of samples.

"An LPC-based Fronthaul Compression Scheme", by Ramalho et al, IEEE Communications Letters, Vol. 21, No. 2, pp 318-321, published February 2017, referred to as [1] below, describes applying Linear Predictive Coding, LPC, to fronthaul IQ samples, achieving high compression ratio while still fulfilling Error Vector Magnitude, EVM, requirements from 3GPP. LPC is related to Differential Pulse Code Modulation, DPCM, but LPC typically uses a high-order predictor in the form of a Finite Impulse Response, FIR, filter, followed by entropy coding. The encoder calculates the difference between the current input sample and a predicted version of the same sample. This difference, called prediction error, residue, or residual, usually has smaller variance, and therefore smaller entropy than the input samples. This allows using fewer bits to represent the quantized residual than the input samples. The decoder undoes any entropy coding and then adds the received prediction error to the output of its own predicted value. Apart from quantization errors, the output of the decoder should follow the input to the encoder. Various methods for calculation of predictors are available in the literature. A common method is to use Levinson-Durbin on the autocorrelation of the input data stream.

Signals with bandlimited flat, i.e. white, spectrum can be compressed efficiently by down-sampling close to the critical Nyquist sample rate although anti-aliasing and reconstruction filters may become very long if the sample rate is too close to Nyquist. This leads to high computational complexity. To keep resampler complexity down, selection of sample frequency might also be restricted so that the fractional resampling ratio becomes a ratio between small integers, e.g. ½, ¾ and similar. However, for signals with colored spectrum, i.e. non-flat PSD curve and/or gaps, down-sampling is not effective as a compression method.

LPC is effective to reduce bit rate for signals with colored spectrum. LPC can use open-loop or closed-loop quantization. A closed-loop LPC method is described in [1]. This method performs well but is difficult to combine with for example block or vector quantization, because the encoder's quantizer is placed in a feedback loop and the prediction filter needs a new input sample every clock cycle to close the feedback loop. Consequently, the quantization process cannot be finished before all samples in each block are available and thus the prediction filter cannot get a new input. Some approaches using iterative or search methods have been proposed in the literature and there is a speech-coder that uses the combination of closed-loop LPC and vector quantization, but the complexity is high. In other words, the closed-loop LPC methods tends to be computationally complex, which is a problem for fronthaul applications with high bit rates and low-latency requirement.

Open-loop LPC methods are less complex than closed-loop LPC methods. For example, it is possible to perform block quantization on prediction errors by delaying the samples by the block size. However, with prior art open-loop LPC methods, quantization noise is added after LPC encoding, which means that the output of the decoder will accumulate quantization errors in its feedback loop. This leads to a degradation of signal quality, which is undesirable. The error accumulation can be mitigated to some extent by frequent predictor reset but each reset will cause additional overhead and thus the bitrate will increase, which is a disadvantage.

Consequently, there is a need for coding solutions for fronthaul applications, which provide efficient and comparatively non-computationally complex coding. Further, the coding solution should be efficient in terms of providing small errors to the data stream, at the same time as comparatively few bits are needed for transporting data.

SUMMARY

It is an object of the invention to address at least some of the problems and issues outlined above. It is possible to achieve these objects and others by using methods, encoders and decoders as defined in the attached independent claims.

According to one aspect, a method is provided performed by an encoder of a base station system of a wireless communication network, for handling a data stream for transmission over a transmission connection between a remote unit and a base unit of the base station system. The remote unit is arranged to transmit wireless signals to, and receive from, mobile stations. Each data stream comprises a plurality of IQ samples comprising a first IQ sample and a second IQ sample. The method comprises quantizing the plurality of IQ samples by a first quantizer and converting, by an encoding predictor, the quantized plurality of IQ samples to predictions of the plurality of IQ samples, the predictions comprising a prediction of the first IQ sample and a prediction of the second IQ sample. The method further comprises calculating on a per IQ sample level, a difference between the quantized plurality of IQ samples and the predictions of the plurality of IQ samples, so that a difference between the quantized first IQ sample and the prediction of the first IQ sample, as well as a difference between the quantized second IQ sample and the prediction of the second IQ sample are calculated, in order to create a plurality of IQ prediction errors. The method then further comprises quantizing the predictions of the plurality of IQ samples before the calculating, or quantizing the plurality of IQ prediction errors after the calculating, by a second quantizer. Then the method further comprises encoding, after the quantizing by the second quantizer, the plurality of IQ prediction errors with fewer bits than a number of bits of the plurality of IQ prediction errors, and sending the encoded plurality of IQ prediction errors over the transmission connection to a decoder of the base station system.

According to another aspect, a method is provided performed by a decoder of a base station system of a wireless communication network, for handling a data stream for transmission over a transmission connection between a remote unit and a base unit of the base station system. The remote unit is arranged to transmit wireless signals to, and receive from, mobile stations. The data stream comprises a plurality of IQ samples comprising a first IQ sample and a second IQ sample. The method comprises receiving, from an encoder of the base station system over the transmission connection, a plurality of encoded IQ prediction errors of the IQ samples of the data stream, comprising a first IQ prediction error and a second IQ prediction error, and decoding the received plurality of encoded IQ prediction errors into more bits than a number of bits of the plurality of encoded IQ prediction errors. The method further comprises converting, in a feed-back loop by a decoder predictor, an output data stream of the decoder comprising the plurality of IQ samples, to predictions of the plurality of IQ samples comprising a prediction of the first IQ sample and a prediction of the second IQ sample, adding the predictions of the plurality of IQ samples to the decoded plurality of IQ prediction errors on a per IQ sample level so that the prediction of the first IQ sample is added to the decoded first IQ prediction error and the prediction of the second IQ sample is added to the decoded second IQ prediction error, in order to create the plurality of IQ samples. The method further comprises quantizing, by a decoder quantizer, the predictions of the plurality of IQ samples before the adding, or quantizing the plurality of IQ samples after the adding.

According to another aspect, an encoder is provided, operable in a base station system of a wireless communication system, for handling a data stream for transmission over a transmission connection between a remote unit and a base unit of the base station system. The remote unit is arranged to transmit wireless signals to, and receive from, mobile stations 180, the data stream comprising a plurality of IQ samples comprising a first IQ sample and a second IQ sample. The encoder comprises a processing circuitry and a memory. The memory contains instructions executable by said processing circuitry, whereby the encoder is operative for quantizing the plurality of IQ samples by a first quantizer and converting, by an encoder predictor, the quantized plurality of IQ samples to predictions of the plurality of IQ samples, the predictions comprising a prediction of the first IQ sample and a prediction of the second IQ sample. The encoder is further operative for calculating, on a per IQ sample level, a difference between the quantized plurality of IQ samples and the predictions of the plurality of IQ samples, so that a difference between the quantized first IQ sample and the prediction of the first IQ sample, as well as a difference between the quantized second IQ sample and the prediction of the second IQ sample are calculated, in order to create a plurality of IQ prediction errors. The encoder is further operative for quantizing the predictions of the plurality of IQ samples before the calculating, or quantizing the plurality of IQ prediction errors after the calculating, by a second quantizer. The encoder is further operative for encoding, after the quantizing by the second quantizer, the plurality of IQ prediction errors with fewer bits than a number of bits of the plurality of IQ prediction errors, and sending the encoded plurality of IQ prediction errors over the transmission connection to a decoder of the base station system.

According to another aspect, a decoder is provided, operable in a base station system of a wireless communication system, for handling a data stream received over a transmission connection between a remote unit and a base unit of the base station system. The remote unit is arranged to transmit wireless signals to, and receive from, mobile stations. The data stream comprises a plurality of IQ samples comprising a first IQ sample and a second IQ sample. The decoder comprises a processing circuitry and a memory. The memory contains instructions executable by said processing circuitry, whereby the decoder is operative for receiving, from an encoder of the base station system over the transmission connection, a plurality of encoded IQ prediction errors of the IQ samples of the data stream, comprising a first IQ prediction error and a second IQ prediction error, and decoding the received plurality of encoded IQ prediction errors into more bits than a number of bits of the plurality of encoded IQ prediction errors. The decoder is further operative for converting, in a feed-back loop by a decoder predictor, an output data stream of the decoder comprising the plurality of IQ samples, to predictions of the plurality of IQ samples comprising a prediction of the first IQ sample and a prediction of the second IQ sample. The decoder is further operative for adding the predictions of the plurality of IQ samples to the decoded plurality of IQ prediction errors on a per IQ sample level so that the prediction of the first IQ sample is added to the decoded first IQ prediction error and the prediction of the second IQ sample is added to the decoded second IQ prediction error, in order to create the plurality of IQ samples. The decoder is further operative for quantizing, by a decoder quantizer, the predictions of the plurality of IQ samples before the adding, or quantizing the plurality of IQ samples after the adding.

According to other aspects, computer programs and carriers are also provided, the details of which will be described in the claims and the detailed description.

Further possible features and benefits of this solution will become apparent from the detailed description below.

BRIEF DESCRIPTION OF DRAWINGS

The solution will now be described in more detail by means of exemplary embodiments and with reference to the accompanying drawings, in which.

DETAILED DESCRIPTION

Briefly described, problems of prior art coding methods for fronthaul are solved by using an open-loop LPC where an additional quantizer is added at the input of the encoder, in addition to an already existing quantizer normally positioned after the predictor of the encoder. Also, a quantizer is added at the decoder. By using two quantizers in the encoder, one at the input and one after the prediction filter, and another quantizer in the decoder, it becomes possible to avoid the error accumulation and the noise shaping in the decoder that occurs in prior art open-loop LPCs. Also, such a solution is less complex than a closed-loop LPC and can therefore act more quickly on incoming signals. In other words, there is low latency, which is important for fronthaul solutions. Also, in order to provide cost-efficient base station systems, remote units of base station systems need to be of low complexity. By using an open-loop LPC as an encoder in a remote unit, the remote unit becomes less complex than if a closed-loop LPC solution was used, thus more cost-efficient.

Further, the quantizers of the encoder may use the same number of quantization levels and the same quantization step size. In an embodiment, the quantizer of the decoder may also use the same number of quantization levels and the same quantization step size. The quantization noise after the decoder will then be white.

Figure 2:
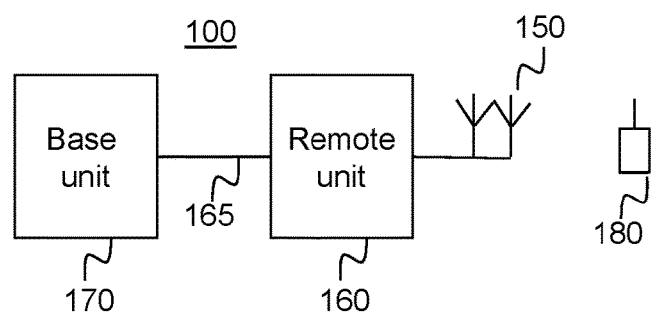
FIG. 2 is a block diagram overview of a base station system in which the present invention may be used.

FIG. 2 shows a base station system 100 of a wireless communication network. The base station system comprises a base unit 170, and a remote unit 160 connected via a transmission connection 165 to the base unit. The transmission connection 165 may be a point-to-point transmission link between the base unit and the remote unit, e.g. a physical transmission line, such as a copper cable or an optical cable or a point-to-point wireless connection. Alternatively, the transmission connection 165 may be any kind of transmission network connecting the base unit with the remote unit, such as an Ethernet network. The transmission network may comprise microwave or millimeter wave links, optical links or electrical conductor links, e.g. metallic conductor links such as copper-based links. The transmission network may also be a wireless meshed network. The transmission network may comprise network switches and/or routers that performs the switching of signals sent over the links of the transmission network between the base unit and the remote unit. The remote unit 160 is in its turn connected to one or more antennas 150, through which the remote unit transmits wireless signals to and receives wireless signals from mobile stations 180. The base unit is normally connected to a plurality of remote units that may or may not use the same transmission connection for connection to the base unit. The base unit 170 of the base station system is in its turn, when connected to a wireless communication network, connected to other nodes of the network, such as other base station, network controlling nodes etc. in a regular way for base stations in wireless communication networks. The wireless communication network may be based on any kind of technology such as 5G New Radio, NR, Long Term Evolution, LTE, Wideband Code Division Multiple Access, W-CDMA, Global System for Mobile communication, GSM, etc.

Figure 3:
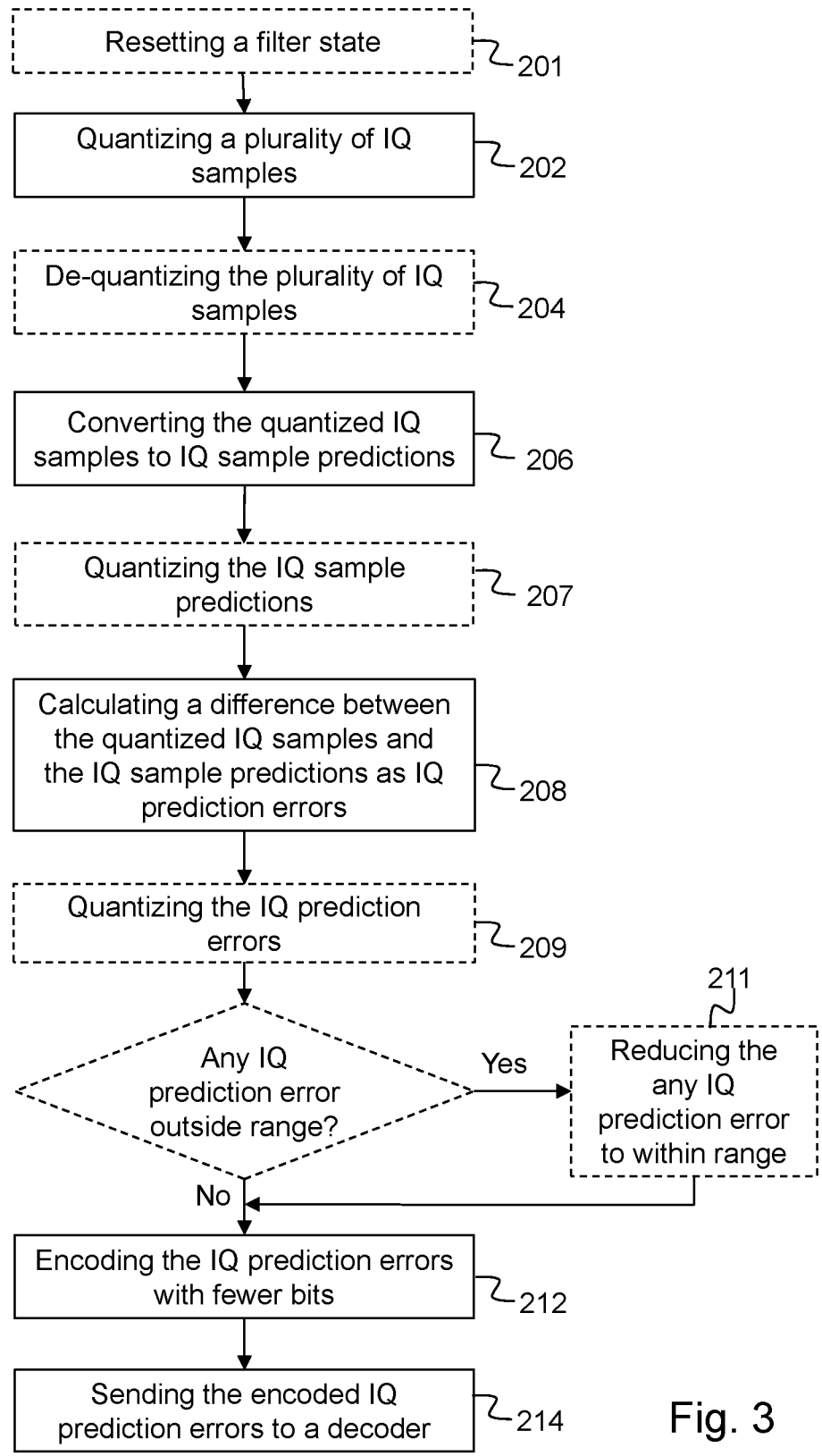
FIG. 3 is a flow chart illustrating a method performed by an encoder of a base station system, according to possible embodiments.

FIG. 3, in conjunction with FIG. 2, describes a method performed by an encoder of a base station system 100 of a wireless communication network, for handling a data stream for transmission over a transmission connection 165 between a remote unit 160 and a base unit 170 of the base station system. The remote unit is arranged to transmit wireless signals to, and receive from, mobile stations 180. Each data stream comprises a plurality of IQ samples comprising a first IQ sample and a second IQ sample. The method comprises quantizing 202 the plurality of IQ samples by a first quantizer and converting 206, by an encoding predictor, the quantized plurality of IQ samples to predictions of the plurality of IQ samples, the predictions comprising a prediction of the first IQ sample and a prediction of the second IQ sample. The method further comprises calculating 208 on a per IQ sample level, a difference between the quantized plurality of IQ samples and the predictions of the plurality of IQ samples, so that a difference between the quantized first IQ sample and the prediction of the first IQ sample, as well as a difference between the quantized second IQ sample and the prediction of the second IQ sample are calculated, in order to create a plurality of IQ prediction errors. The method then further comprises quantizing 207 the predictions of the plurality of IQ samples before the calculating 208 or quantizing 209 the plurality of IQ prediction errors after the calculating, by a second quantizer, encoding 212, after the quantizing 207, 209 by the second quantizer, the plurality of IQ prediction errors with fewer bits than a number of bits of the plurality of IQ prediction errors, and sending 214 the encoded plurality of IQ prediction errors over the transmission connection 165 to a decoder of the base station system.

A signal that is transmitted over a wireless connection typically comprises a radio frequency (RF) carrier modulated with a data stream (e.g. user data and control). A convenient way to describe the sampled data stream and thus also the amplitude and phase modulation of the RF carrier is to use a complex number format in Cartesian coordinates. A sampled data stream described in such a complex number format is called, or comprises, IQ samples (or sometimes also I/Q samples, IQ data, I/Q data, IQ format, or I/Q format). The data stream can be described as a plurality of consecutive IQ samples, wherein each IQ sample consists of an I sample corresponding to the real part of the complex number format and a Q sample corresponding to the imaginary part of the complex number format. The IQ samples may be time-domain IQ samples. With time-domain IQ samples, the data stream is typically centered at zero frequency or at some other frequency lower than half the signal bandwidth. If the data stream is centered at a frequency larger than or equal to half the signal bandwidth, the resulting signal becomes real (all Q samples have zero value and do not need to be processed) but a real data stream requires twice as high sample frequency compared with what is required when the data stream is centered at zero frequency. The converting, by the predictor may be done based on historical samples, i.e. "a first IQ sample" may be predicted based on IQ samples arriving before "the first IQ sample". It is also possible, when buffering IQ samples for a whole packet before performing the converting, to use future samples, and possibly also historical samples, to predict "the first IQ sample". An encoding predictor is any kind of unit at the encoder that is able to predict an IQ sample, e.g. based on earlier IQ samples. The predictor may be a predictive filter, such as a FIR filter. The terms "a first IQ sample" and "a second IQ sample", do not necessarily mean the first and second IQ samples of an OFDM symbol, or even that the second IQ samples comes after the first IQ sample in the data stream. Instead, the terms "first and second IQ samples" are merely used for any two IQ samples in a data stream, in order to be able to discuss two single IQ samples of the plurality of IQ samples. For downlink communication, the encoder is located at the base unit 170 and the decoder is located at the remote unit 160. For uplink communication, the encoder is located at the remote unit 160 and the decoder is located at the base unit 170. In case there are any intermediate nodes arranged between the base unit and the remote unit, the encoder and/or the decoder can be arranged at any of the intermediate nodes. The second quantizer may either be positioned so that it quantizes the predictions of the plurality of IQ samples, i.e. before the calculating of the IQ prediction errors, or the second quantizer may be positioned so that it quantizes the plurality of IQ prediction errors, i.e. after the calculating of the IQ prediction errors. The encoding 212 of the plurality of IQ prediction errors with fewer bits than a number of bits of the plurality of IQ prediction errors may be performed by entropy encoding, or any other lossless compression scheme that reduces the average number of bits.

By quantizing the IQ samples one extra time compared to prior art open-loop LPC, error accumulation and quantization noise shaping of the prior art open-loop is reduced, which results in a less noisy signal to be sent over the transmission connection. Consequently, the data stream to be transmitted can be compressed more efficiently in the entropy encoding. Further, the signal quality, e.g. Error Vector Magnitude, EVM, or Signal to Quantization Noise Ratio, SQNR, after LPC decoding is improved compared to prior art open-loop LPC. Also, this open-loop solution of the encoder has lower complexity than prior art closed-loop LPC, such as the closed-loop LPC described in [1], and performs as well as, or at least almost as well as the prior art closed-loop LPC.

According to a first embodiment, the first quantizer and the second quantizer have the same number of quantization levels. According to a second embodiment, which may be combined with the first embodiment, the first quantizer and the second quantizer have the same quantization step size. By using the same number of quantization levels and/or the same quantization step size for the first and the second quantizer, error accumulation of the encoder can be even more reduced. Further, also a quantizer of the decoder may use the same number of quantization levels and/or the same quantization step size as the first and/or the second quantizer.

Figure 1:
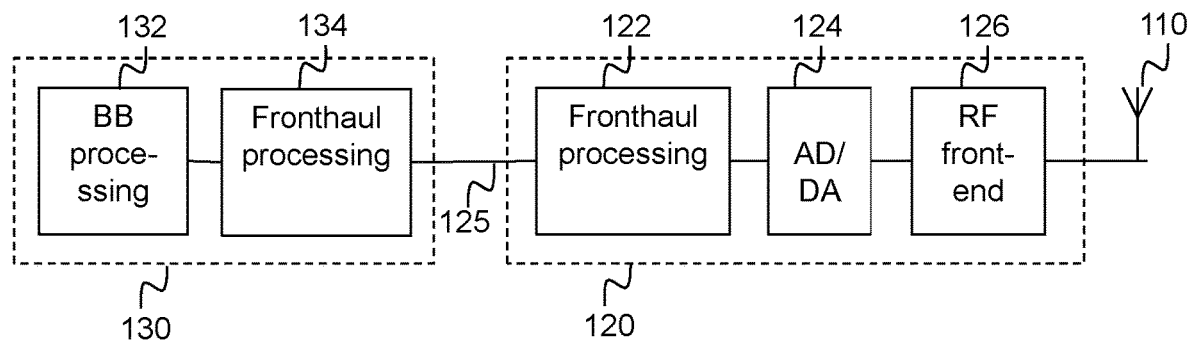
FIG. 1 is a schematic block diagram of a base station system according to the prior art.

According to another embodiment also shown in FIG. 1, the method further comprises, when any of the IQ prediction errors is outside a predetermined range, reducing 211 the any IQ prediction error until the any IQ prediction error is within the predetermined range. Hereby, the number of quantization bits can be kept on a lower level than if no reducing would have taken place. Consequently, less computing power is needed in the encoder and less number of bits are needed to be sent over the transmission connection. Also, transients in the prediction error can be avoided, or at least considerably decreased. The predetermined range may be a predetermined range of any of the quantizers.

According to a variant of this embodiment, the reducing 211 comprises reducing the any IQ prediction error modulo M, where M is the number of quantization levels of the first quantizer, which number of quantization levels is related to the predetermined range. The number of quantization levels may for example be the same as the predetermined range. When the predetermined range is the same as the number of quantization levels of the first quantizer, the any IQ prediction error is reduced by the span of the predetermined range. E.g. if the range is [−256, 255], the span of the range is 512. Consequently, when the any IQ prediction error is 257, 257 is reduced by 512, ending on −255. In other words, by reducing modulo M, the value is "wrapped around the span" when reaching a value. If a prediction error needs to be reduced modulo M in the encoder, e.g. by subtracting 512, the output of the addition operation in the decoder will also be outside the predetermined range since the decoder contains an identical predictor as the encoder and since the transmitted prediction error is now offset by 512 (or any integer multiple of the span of the predetermined range). By performing modulo M reduction also in the decoder (e.g. by adding 512), the output will get back in the predetermined range and the resulting output of the decoder will be the same as if no modulo M reduction had to take place. Thus, prediction error transients do not affect the output of the decoder, which is a big advantage. This is possible since the input signal fits in the predetermined range of the first quantizer by design. Further, since the output signal of the decoder is identical to the output of the first quantizer (assuming no errors occurred in the fronthaul link), the correct output signal must be within the pre-determined range. Reduction modulo M is thus different from the saturation operation that is typically performed in digital filters and other types of signal processing, since saturation cannot be undone in a decoder and would thus cause unrecoverable signal quality degradation. Apart from reducing prediction error transients without degrading signal quality, the modulo M reduction also greatly simplifies the use of block floating point together with LPC. Without modulo M, the exponent would need to be increased when the mantissa overflows but since there is only one exponent per block in block floating point, the exponent cannot suddenly change if the overflow occurs somewhere within a block.

According to another embodiment, the method further comprises, when transmission of a new packet of the data stream is to begin, resetting 201 a filter state of the encoder predictor to a predetermined state. Hereby, error propagation from one packet to the next is avoided. The filter state of a corresponding decoder predictor at the decoder is reset to the same predetermined state as the encoder predictor. The encoder predictor may be reset at transmission start of each packet or at transmission start of some packets, e.g. every second packet. The decoder predictor may be reset when reception of a new packet is to begin, or at reception start of some packets, e.g. every second packet. The decoder may be informed by the encoder, via the transmission connection, when to reset its filter state so that the encoder predictor and the decoder predictor are reset at the same IQ sample. This may also be achieved by configuration, e.g. reset at each packet start or reset at each second packet, etc.

According to another embodiment, in the first quantizer as well as in the second quantizer, the quantizing 202, 210 is performed by quantizing the first IQ sample to a basic value added with a first IQ-sample specific value, and quantizing the second IQ sample to the basic value added with a second IQ-sample specific value. The basic value may be a complex value, which may have one part for I and one part for Q. Hereby, the calculation 208 of a difference only has to be performed on the IQ sample specific values and not on the basic value as it is the same for the first and the second IQ sample. This reduces computation complexity since the difference calculation 208 is performed on fewer bits than if performed on the original value of the input samples. The same basic value may be used for more than two IQ samples, preferably on a plurality of consecutive IQ samples. If block floating point is used in the first and second quantizer, the basic value is the exponent and the first and second IQ sample specific values are the respective mantissas, i.e. $1.2345*10^2$, where the basic value is $10^2$, which could be sent as "2", and the specific value is 1.2345. Of course, also base 2 or 16 or any other base may be used instead of base 10. If block scaling is used, the basic value is a scaling factor and the first and second IQ specific values are normalized with the scaling factor, thus reducing the dynamic range. The scaling factor could be represented e.g. in fixed-point format, floating-point format, or logarithmic format. According to a variant of this embodiment, the encoder sends the basic value of the first quantizer over the transmission connection 165 to the decoder. Hereby, a quantizer of the decoder can use the same basic value as the first and second quantizer of the encoder uses.

According to different embodiments, the encoder may inform the decoder of one or more of the following characteristics: used entropy encoding dictionary; number of quantization levels and quantization step size of the first and second quantizer, filter coefficients and filter state of the encoder predictor, so that the decoder can adapt its corresponding characteristics to these characteristics. Alternatively, one or more of the above characteristics may be preconfigured at the encoder and the decoder.

According to another embodiment, the method further comprises de-quantizing 204 the quantized plurality of IQ samples, quantized by the first quantizer, and wherein the converting 206 is performed on the de-quantized quantized plurality of IQ samples. For good performance, the encoder predictor should operate with more bits internally than the number of bits received after the quantization at the first quantizer. To achieve this, there may be a step of de-quantizing the already quantized plurality of IQ samples to more bits again, before converting the plurality of IQ samples to predictions of the plurality of IQ samples in the encoder predictor. This could be realized by an inverse quantizer at the input of the encoder predictor, or by the encoder predictor operating with increased bit resolution internally. The decoder predictor should preferably operate with the same bit resolution internally as the encoder predictor.

Figure 4:
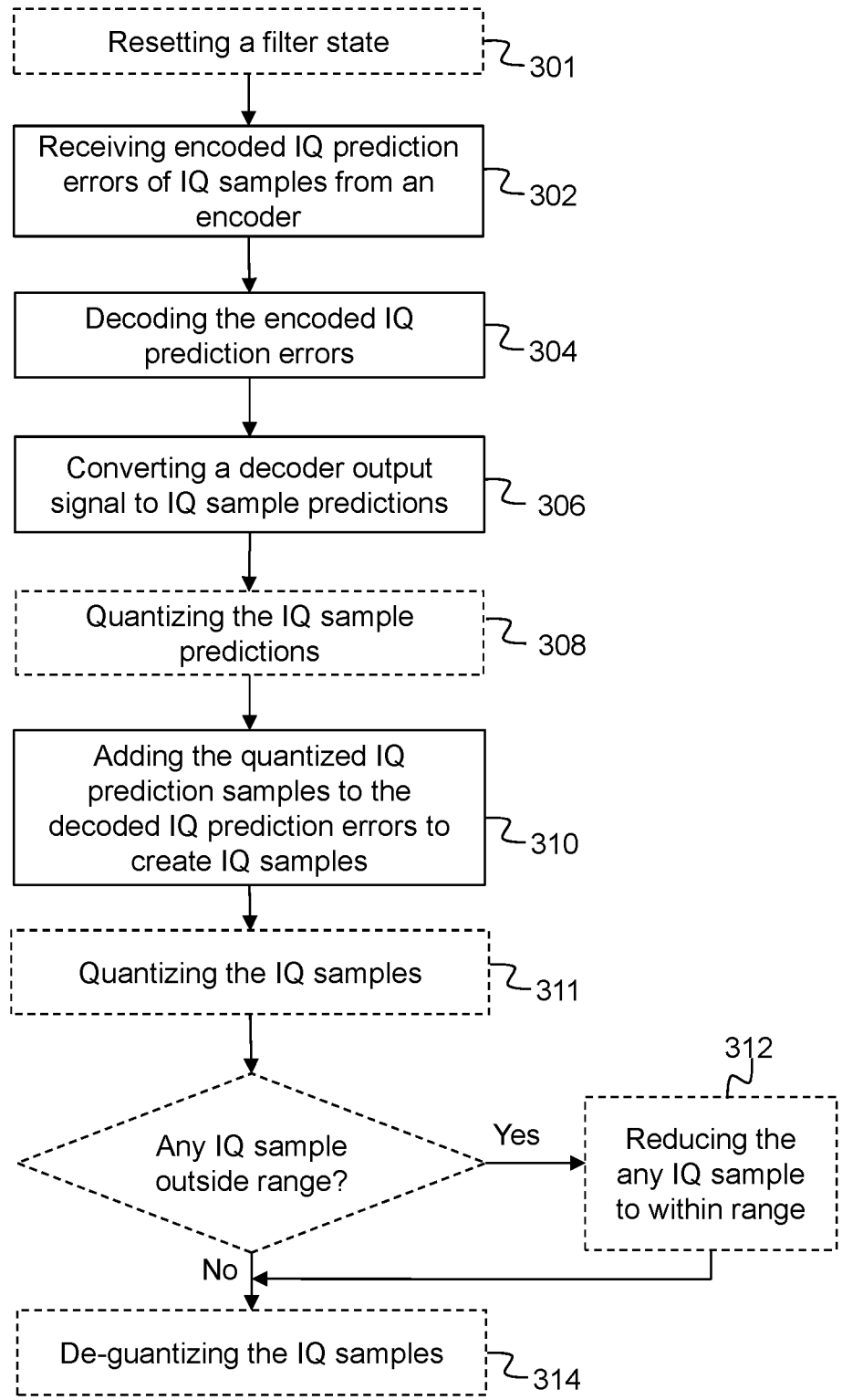
FIG. 4 is a flow chart illustrating a method performed by a decoder of a base station system, according to possible embodiments.

FIG. 4, in conjunction with FIG. 2, describes a method performed by a decoder of a base station system 100 of a wireless communication network, for handling a data stream for transmission over a transmission connection 165 between a remote unit 160 and a base unit 170 of the base station system. The remote unit is arranged to transmit wireless signals to, and receive from, mobile stations 180. The data stream comprises a plurality of IQ samples comprising a first IQ sample and a second IQ sample. The method comprises receiving 302, from an encoder of the base station system 100 over the transmission connection 165, a plurality of encoded IQ prediction errors of the IQ samples of the data stream, comprising a first IQ prediction error and a second IQ prediction error, and decoding 304 the received plurality of encoded IQ prediction errors into more bits than a number of bits of the plurality of encoded IQ prediction errors. The method further comprises converting 306, in a feed-back loop by a decoder predictor, an output data stream of the decoder comprising the plurality of IQ samples, to predictions of the plurality of IQ samples comprising a prediction of the first IQ sample and a prediction of the second IQ sample, and adding 310 the predictions of the plurality of IQ samples to the decoded plurality of IQ prediction errors on a per IQ sample level so that the prediction of the first IQ sample is added to the decoded first IQ prediction error and the prediction of the second IQ sample is added to the decoded second IQ prediction error, in order to create the plurality of IQ samples. The method further comprises quantizing 308, by a decoder quantizer, the predictions of the plurality of IQ samples before the adding, or quantizing 311 the plurality of IQ samples after the adding.

The decoding may use a decoding scheme corresponding to an encoding scheme used by the encoder. The decoding may be entropy decoding. The entropy decoding may use the same entropy encoding dictionary as used by the encoder. A decoder predictor is any kind of unit at the decoder that is able to predict an IQ sample, e.g. based on earlier IQ samples, such as a predictive filter. The decoder quantizer may either be positioned in a feedback loop, before the adding, so that it quantizes 308 the predictions of the plurality of IQ samples, or the decoder quantizer may be positioned after the adder so that it quantizes 311 the plurality of IQ samples.

According to an embodiment, the quantizing 308 comprises quantizing the predictions of the plurality of IQ samples or the plurality of IQ samples using a same number of quantization levels and quantization step size as used at a quantization performed by the encoder. The decoder may receive, from the encoder, information on the number of quantization levels and quantization step size used by a quantizer of the encoder, e.g. the first or second quantizer of the encoder. Alternatively, the decoder and the encoder may be pre-configured to use one and the same quantization level and quantization step.

According to another embodiment, when any of the plurality of quantized IQ samples is outside a predetermined range, reducing 312 the any of the plurality of IQ samples until the any quantized IQ sample is within the predetermined range. This may be accomplished by performing a check whether the adding 310 creates a value outside the predetermined range, and if so, reducing the one of the plurality of IQ samples as above. Alternatively, the carry bit in the addition, i.e. above the number of bits needed for the quantizer may be ignored. If the quantizer has 8 bits and we use an 8-bit signed integer without saturation logic, the modulo M reduction would then happen automatically. Another alternative regarding how to perform modulo M reduction is to perform sign-extension after addition, i.e. copy the bit corresponding to the quantizer sign bit to all higher bits in the data type used in the addition. Preferably, the "M" should be the same value as the "M" used in the encoder According to an alternative of this embodiment, the reducing 312 comprises reducing the any of the plurality of IQ prediction errors modulo M, where M is a number of quantization levels of the decoder quantizer, which number of quantization levels is related to the predetermined range. Preferably, the decoder quantizer has the same number of quantization levels as the first quantizer of the encoder.

According to another embodiment, when receiving information from the encoder that transmission of a new packet is to begin, resetting 301 a filter state of the decoder predictor to a predetermined state.

According to another embodiment, the quantizing 308 is performed by quantizing the prediction of the first IQ sample or the first IQ sample to a basic value added with a first IQ-sample specific value, and quantizing the prediction of the second IQ sample or the second IQ sample to the basic value added with a second IQ-sample specific value. The decoder may receive the basic value from the encoder.

According to another embodiment, the method further comprises de-quantizing 314 the plurality of IQ samples. The de-quantizing might include proper scaling of the output signal. Here "de-quantizing" might imply using the same number of bits as before quantization, which therefore also may be called "re-quantizing".

In an LPC encoder, a predictor, such as a linear FIR filter is used to provide an output $\hat{x}[n]$ predicting a current IQ sample $x[n]$ from the $N_p$ most recent IQ samples $x[n-j]$, where $j=\{1,2,\ldots N_p\}$, using a predictor filter A with $N_p$ coefficients.

$$\tilde{x}[n] = A * x[n] = \sum_{j=1}^{N_p} a_j \cdot x[n-j].$$

The input data stream $x[n]$, where n is the IQ sample index, may already be quantized with a high-rate quantizer, e.g. 14-16 bits per sample, when reaching the base unit from a CPRI link in downlink direction or in the remote unit from an A/D converter of the remote unit in uplink direction. In order to achieve significant bit rate savings and to avoid entropy encoders with very large dictionaries, the LPC encoder should typically work with much fewer bits, perhaps 6-8 bits or even lower. Then, the residual, i.e. the difference between the current sample $x_i$ and the predicted sample $\hat{x}_i$, is typically entropy encoded before transmission to the decoder. LPC reduces the bit rate if samples are correlated, e.g. due to oversampling or non-flat power-spectral density. Differential coding is an example of a first order predictor where $a_1=-1$ and $N_p=1$. Higher order predictors usually give better performance but the optimum predictor depends on the power spectral density, PSD, shape of the signal. Various schemes have been proposed in the literature regarding efficient representation of LPC coefficients (e.g. using so called line spectral pairs) and are not discussed here. Methods to calculate the predictor for LPC are available in the literature and may not be specific for the invention. However, it may be preferable that after output quantization and for a given input, the decoder predictor provides identical output as the encoder predictor. Predictor coefficients for the decoder are normally calculated so that the output of the decoder follows the input to the encoder. According to an embodiment, predictor coefficients of the decoder may be calculated using autocorrelation of the data stream to the encoder after the first quantizer instead of the actual input data stream to the encoder, since the first quantizer changes the power spectral density of the signal.

If the PSD does not change, the predictor doesn't change and the predictor coefficients do not have to be sent over the fronthaul connection to the decoder. However, if it is desired to dynamically optimize the predictor when the signal's PSD changes, then the predictor needs to be sent over the fronthaul connection. To reduce bitrate overhead from predictor updates, it is usually desired to limit the length, i.e. order, of the predictor. For a given case, there may be an optimal predictor length that yields the lowest total bitrate, i.e. the best balance between predictor accuracy and the overhead of predictor update.

In the following analysis, it is assumed (unless otherwise stated) that the fronthaul connection is error-free. Any bit error in the prediction residual will propagate in the decoder due to the feedback loop of the decoder and may necessitate predictor reset in the encoder and decoder in order to resume proper operation.

Figure 5:
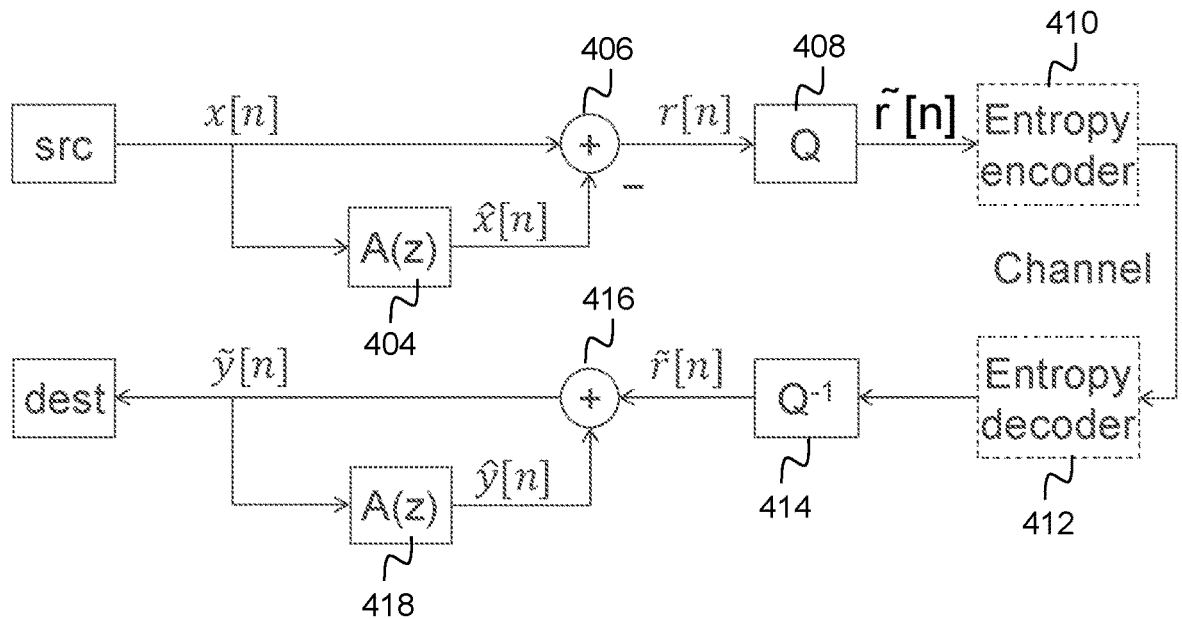
FIG. 5 is a schematic block diagram of a prior art solution, based on open-loop LPC.

FIG. 5 shows a prior art open-loop LPC encoder and connected decoder, connected via a fronthaul connection, marked in FIG. 5 with "channel". An input data stream x[n] is received at an input of the encoder, from a source (src), which may be any kind of connection serving the encoder input with the input data stream x[n], x is the data stream comprising IQ samples and n represents time, or order, index for each IQ sample. The input data stream x[n] is fed to a predictor 404 having coefficients (in the z-transform domain) A(z). The predictor 404 determines predictions x̂[n] of the IQ samples as in formula (1) below. IQ prediction errors, or residuals, r[n] are calculated in an adder 406 as a difference between the input data stream x[n] and the predictions x̂[n], for each IQ sample, see formula (2). Thereafter, the IQ prediction errors r(n) are quantized in a quantizer 408 into quantized IQ prediction errors r̃[n]. As seen in formula (3), the quantizer Q is modelled by addition of quantization noise w[n].

$$\hat{x}[n] = A * x[n] \quad (1)$$

$$r[n] = x[n] - \hat{x}[n] \quad (2)$$

$$\tilde{r}[n] = Q(r[n]) = r[n] + w[n] \quad (3)$$

In a practical embodiment, the quantizer could also change range, e.g. by multiplication or look-up table, and thus an inverse quantizer, or de-quantizer 414 in the decoder would be needed to change the range back in the decoder, but to keep equations more readable, such operations are omitted and will not affect the result. After quantization, the IQ prediction errors are encoded in an entropy encoding unit 410 before the encoded, quantized IQ prediction errors are sent over the communication channel to the decoder. In the decoder, the encoded, quantized IQ prediction errors are decoded in an entropy decoding unit 412 and, optionally, de-quantizing in the de-quantizer 414. The de-quantizer 414 converts back to the original format and/or range without changing quantization noise. Using a feedback loop, the decoder then adds in an adder 416 predictions of IQ samples, determined from earlier output samples, in a predictor 418 having the same coefficients as in the predictor 404 of the encoder, to the received IQ prediction errors r̃[n], in order to receive the output data stream ỹ[n].

In z-transform domain, the output of the encoder becomes:

$$\tilde{R}(z) = Q(X(z) - A(z)X(z)) = X(z)(1 - A(z)) + W_R(z),$$

where $W_R(z)$ is the quantization error and $H(z) = 1 - A(z)$ is denoted analysis filter. $H(z)$ is the transfer function of the whole encoder except for the quantizer. The decoder then uses $H^{-1}(z)$ as the synthesis filter, i.e. as the transfer function for the whole decoder, in order to get the output $\hat{Y}(z)$:

$$\tilde{Y}(z) = \tilde{R}(z)H^{-1}(z) = \frac{\tilde{R}(z)}{1 - A(z)} =$$

$$X(z) + \frac{W_R(z)}{1 - A(z)} = X(z) + W_R(z) + \frac{W_R(z)A(z)}{1 - A(z)} = \tilde{X}(z) + \frac{W_R(z)A(z)}{1 - A(z)}.$$

The result is that the quantization noise $W_R(z)$ at the output of the decoder is shaped by the synthesis filter, which might not be desirable. Further, the synthesis filter is an Infinite Impulse Response, IIR filter, which means that there might be accumulation of quantization errors over time, which is undesirable since it leads to a degradation in signal quality.

To avoid error accumulation, closed-loop LPC is often used, instead of the above prior art open-loop encoder. For closed-loop LPC, the encoder has an embedded decoder. A similar derivation as the above for closed-loop LPC gives $$\tilde{R}(z) = Q(X(z) - A(z)\tilde{X}(z)) = X(z) - A\tilde{X}(z) + W_R(z),$$

and the embedded decoder is represented by $$\tilde{X}(z) = \frac{\tilde{R}(z)}{1 - A(z)}.$$

Combining these two equations leads to $$\tilde{R}(z) = (X(z) + W_R(z))(1 - A(z)) = \tilde{X}(z)(1 - A(z)),$$

$$\tilde{Y}(z) = \frac{\tilde{R}(z)}{1 - A(z)} = X(z) + W_R(z) = \tilde{X}(z),$$

i.e. the decoded value is a quantized version of the input data stream, with quantization noise that does not depend on the predictor. This is usually a desired property and therefore closed-loop LPC is commonly used. However, a disadvantage with closed-loop LPC is that the encoder is more complicated because the embedded decoder doubles the number of add/subtract operations.

Figure 6:
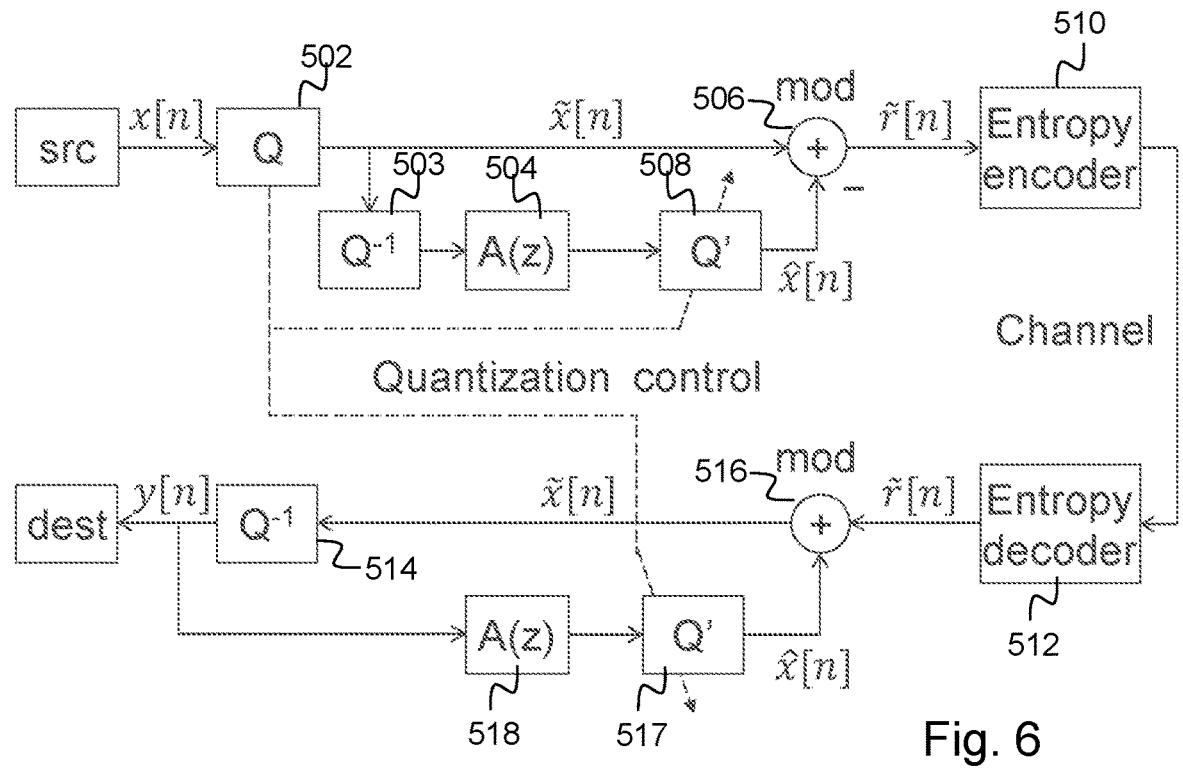
FIG. 6 is a schematic block diagram of a solution according to embodiment of the invention, based on open-loop LPC.

The current invention addresses the problems of prior art by modifying open-loop LPC to include an additional quantizer, in the following called first quantizer, on the input of the encoder. FIG. 6 shows an encoder and decoder according to an embodiment of the invention, which utilizes a modified open-loop LPC at the encoder. The encoder and the decoder are connected via a fronthaul connection, marked in FIG. 6 with "channel". An input data stream x[n] is received at an input of the encoder, from a source, src, which may be any kind of connection serving the encoder input with the input data stream. The input data stream x[n] is fed to a first quantizer 502 that quantizes the IQ samples of the input data stream. The data stream quantized in the first quantizer 502 is fed to an optional de-quantizer 503 for de-quantizing for thereafter being fed to a predictor 504 having coefficients A(z), in z-transform domain. In sampled time-domain, the coefficients would be a1, a2, a3 etc. The de-quantizing may actually be a re-quantizing as the number of bits do not need to be the same as before the first quantizer. The predictor 504 determines predictions x̂[n] of the IQ samples. The predictions are quantized in a second quantizer 508. The second quantizer 508 may either be situated at this position or between a calculation unit 506 and an entropy encoding unit 510. The (quantized) predictions x̂[n] are then subtracted from the quantized input data stream x̃[n] in the calculation unit 506 in order to produce the IQ prediction errors r̃[n], see formula (4).

After quantization, the IQ prediction errors are encoded in an entropy encoding unit 510 before the encoded, quantized IQ prediction errors are sent over the fronthaul connection to the decoder. In the decoder, the encoded, quantized IQ prediction errors are decoded in an entropy decoding unit 512 and, optionally, de-quantized in a de-quantizer 514. Using a feedback loop, the decoder then adds in an adder 516, predictions of IQ samples determined in a decoder predictor 518 based on earlier output samples, to the received IQ prediction errors r̃[n]. The decoder predictor 518 has the same coefficients as the predictor 504 of the encoder. The predictions of the IQ samples are quantized in a decoder quantizer 517 before or after they are added to the received prediction errors r̃[n] in order to receive quantized IQ samples x̃[n]. The quantized IQ samples are de-quantized in the de-quantizer 514 in order to achieve the output data stream ỹ[n].

The first quantizer 502 is selected to have the same number of quantization levels and the same quantization step size as the second quantizer 508. The encoder can be modelled as follows:

$$\tilde{x}[n]=Q(x[n])$$

$$\tilde{r}[n]=Q(\tilde{x}[n]-A*\tilde{x}[n])=\tilde{x}[n]-Q(A*\tilde{x}[n])=\tilde{x}[n]-\hat{x}[n] \quad (4)$$

From the formulas for r̃[n] above, it is visible that the second quantizer 508 can be placed after the encoder predictor 504 instead of after the calculation unit 506 as long as care is taken with the rounding method. For some rounding methods, the output of the encoder could sometimes change one quantization step if the second quantizer is moved, especially if a value to be quantized is exactly in the middle between two quantization steps. Many different rounding methods are known, e.g. to round towards negative infinity, towards positive infinity, towards zero, away from zero, towards the nearest even integer, or randomly with equal probability towards the two nearest integers. To avoid the potential problem that the encoder output changes somewhat due to the chosen rounding method, it is preferred to move both the second quantizer 508 in the encoder and the decoder quantizer 517 so that either both are placed after their respective predictor or after the respective adders. In z-transform domain, the output data stream of the encoder becomes $$\tilde{R}(z)=Q(\tilde{X}(z)(1-A(z)))=\tilde{X}(z)-Q(A(z)\tilde{X}(z))=\tilde{X}(z)(1-A(z))-W_{A\tilde{X}}(z),$$

where $W_{A\tilde{X}}(z)=Q(A(z)\hat{X}(z))-A(z)\tilde{X}(z)$ is the second quantizer's contribution to the quantization error.

The output data stream of the decoder will be the following, taking account for the decoder quantizer, which is new compared to prior art of FIG. 5:

$$\tilde{Y}(z) = Q(\tilde{R}(z) + A(z)\tilde{X}(z)) =$$
$$\tilde{X}(z)(1 - A(z)) - W_{A\tilde{X}}(z) + Q(A(z)\tilde{X}(z)) = \ldots = \tilde{X}(z).$$

Similarly as for the prior art closed-loop LPC, the embodiment will output a quantized version of the input, without the undesirable error accumulation present in the prior art open-loop LPC of FIG. 5. In fact, the decoder will output identical values as after the first quantizer 502 of the encoder. As with prior art closed-loop LPC, the quantization noise does not depend on the predictor 504. Since the embodiment is based on open-loop LPC, it requires only half the number of add/subtract operations compared with closed-loop LPC. The price to pay is slightly higher entropy compared with closed-loop LPC, due to the term $W_{A\tilde{X}}(z)$ in $\tilde{R}(z)$. $W_{A\tilde{X}}(z)$ represents a small increase of the prediction error, corresponding to the quantization error of the predicted quantized IQ sample. Thus, it increases the bitrate somewhat on the fronthaul. However, the error is cancelled in the decoder and does not appear on the output, which means that it does not affect signal quality.

In closed-loop LPC, the quantizer only needs to be able to quantize the prediction residual, while in the embodiment, the quantizer has to have sufficient dynamic range to quantize the input data stream. Thus, with embodiments of the invention, high-magnitude quantizer output values will be unlikely and after entropy coding, the bit rate difference compared with prior art closed-loop LPC will not depend on quantizer range or number of quantizer levels but mainly on the small additional term $W_{A\tilde{X}}(z)$.

At the boundary between two OFDM symbols, the signal and its derivatives are discontinuous. The discontinuities can be mitigated to some extent e.g. by carrier filtering. However, even with filtering, such discontinuities reduce the sample-to-sample correlation and may cause a transient at the output of an LPC encoder because the prediction error, i.e. residual, suddenly increases and its magnitude can become larger than that of the input signal. Also, large residuals can occur for a longer time period if the predictor is not matched to the current signal properties, e.g. due to change in scheduling load on OFDM subcarriers. If overflow occurs in the LPC encoder, it is usually necessary to reset the encoder and decoder to a known state in order to recover. This will introduce additional overhead and delay. Further, the reset itself can also cause a transient unless care is taken when selecting a reset state.

In case of such transients and/or predictor mismatch, the prediction residual r̃[n] may have larger magnitude than the input signal. Prior art LPC methods typically try to prevent overflows e.g. by increasing the number of bits in the quantizer for the prediction residual. This increases complexity, due to that larger datatypes are needed during calculation, and due to that a larger dictionary may be needed for entropy coding. According to an embodiment of this invention, it is proposed to use modular arithmetic when calculating the prediction residual in the encoder and when calculating the output data stream in the decoder. With modular arithmetic, the expression for the prediction residual becomes $$\tilde{r}[n]\equiv\tilde{x}[n]-\hat{x}[n](\text{mod } M).$$

This can also be written as $$\tilde{r}[n]=\tilde{x}[n]-\hat{x}[n]+kM$$

where k is an integer and M is the modulus. In this invention, the modulus is selected as the number of quantization levels. If the quantized IQ samples subtracted with the predicted IQ samples, i.e. x̃[n]−x̂[n], exceeds a range of allowed values in r̃, the result of the subtraction is reduced modulo M to fit the range, e.g. by adding kM with a suitable k. This means that transients and predictor mismatches will no longer be able to cause overflow. However, despite the modulo operation, the variance of the prediction residual might increase somewhat during a transient, and thus bitrate after entropy coding will also increase. When the encoder performs modular arithmetic, the decoder also needs to perform modular arithmetic in its addition operation. It should be noticed that it is not necessary to send k over the channel; the first quantizer 502 is selected to have sufficient range for the input signal. Thus, the output of the decoder should also fit in the same range and only one value of k (the same as in the encoder) will give an output value in the same range as the input signal.

As an example of modular arithmetic, quantization levels in the range $$\left[-\frac{M}{2}, \frac{M}{2}-1\right]$$

could be used. If the result of addition or subtraction is outside this range, then add or subtract a multiple of M until the value is in the range. Thus, $$-\frac{M}{2}-1$$

becomes $$\frac{M}{2}-1.$$

If two's complements format with $\log_2 M$ bits is used, modular arithmetic can be implemented with simple wraparound, disabling the commonly used saturation logic in digital signal processing.

For communication signals with large dynamic range, such as the uplink for wireless communication systems, quantizers may need many levels to both support weak signals close to the noise floor and to support strong signals without clipping distortion. If fixed-point representation is used, Signal-to-Quantization-Noise-Ratio (SQNR) will be proportional to signal power. However, in practical communication systems, performance will not increase much once the requirements for the highest supported modulation order is met. This means that strong signals may get unnecessarily high SQNR, which also implies unnecessarily high entropy. Here, floating-point representation, or some type of block scaling, may be advantageous since dynamic range and max SNR can be optimized separately by changing the number of exponent levels and the number of mantissa levels respectively.

Floating-point format is suitable for handling signals with large dynamic range but sending both mantissa and exponent for each sample may lead to high bit rate requirements. If the dynamic range variation is slow, the number of bits needed for quantization may be reduced without significant performance loss by sharing a common exponent over multiple samples. This is known as block floating-point. A related scheme is block scaling, where a block of samples share a common scaling factor. Here, the term block quantization is used for such schemes. In block quantization, the quantization of one sample depends on other samples within a block of samples. Low-complexity block quantization schemes like block floating-point and block scaling are effective in handling signals with large dynamic range but they are not effective in reducing bit rate for signals with colored spectrum. High-dimensional vector quantization can be effective for signals with colored spectrum but the complexity is often too high for practical implementations.

According to embodiments of the invention, block floating point is used for a block of IQ samples. Then the block exponent for sample n is determined in the first quantizer 502. The second quantizer 508 and the quantizer 517 of the decoder will use the same exponent and the same number of levels for the mantissa as the first quantizer 502. The second quantizer 508 and the quantizer 517 in the decoder may work as slaves to the first quantizer, in other words, they will follow the first quantized being instructed to use the same exponent and the same number of levels as the first quantizer. Thus the quantization step will be the same for the second quantizer 508 and the quantizer 517 of the decoder as for the first quantizer 502. The quantization control information needed in the slave quantizers 508, 517 in this case is the number of mantissa bits, which may be configured in advance, and the exponent, which may be sent over the fronthaul to the quantizer 517 of the decoder. Keeping the exponent fixed might first seem as a disadvantage; since the exponent is not changed during LPC encoding/decoding, it is possible that the mantissa of $\hat{x}[n]$ will overflow even by a small prediction error, if the mantissa of $\tilde{x}[n]$ is close to one of the endpoints. However, this overflow is handled by the modular arithmetic in the same way as input transients and predictor mismatch. A benefit of keeping the exponent constant is that the modular addition/subtractions only have to be performed on the mantissa values. This reduces the complexity since operations are performed on fewer bits than the format of the input samples. A similar reduction of complexity is possible for other block quantization formats, e.g. block scaling.

The following steps describe how to implement an embodiment of the invention: Determine a suitable predictor to use in the encoder and decoder, either off-line before start of communication, or dynamically if it is desired to have an adaptive predictor. Determining a suitable predictor signifies calculating predictor coefficients that are suitable for the signal. Typically, it is based on the power spectral density or on the autocorrelation function. The predictor coefficients could either be calculated from known properties of the input data stream, e.g. sample rate and bandwidth, or power spectral density, or autocorrelation, or trained on typical signals. Thereafter, the following steps may be performed for block quantization in the encoder:

1. Collect one block of samples according to a chosen block quantization format;
2. Convert the samples in one block to the selected block quantization format;
3. Repeat from step 1 until the desired number of blocks for one packet have been processed.

Steps to be performed by the encoder, according to a possible embodiment:

1. If this is the first IQ sample in one packet, preferably reset the predictors 504, 518 in the encoder and decoder to the same state, e.g. all zeroes. Alternatively, send the first $N_{pred}$ samples uncoded and use these samples to initialize the predictors 504, 518. To reduce overhead when fronthaul packet loss is low, reset can be performed e.g. in every N-th packet or on demand instead of in every packet but this is not recommended if packet loss is frequent. If reset is performed in every packet, there is no need for additional control information but if it is performed more seldom, it is necessary to exchange information about when to reset.
2. Input one sample at a time from block quantization into the predictor and calculate the residual.
3. Apply entropy encoding, e.g. Huffman coding, on the prediction residual.
4. Repeat from step 1 until the desired number of samples for one packet have been processed.

Step 2 for the encoder above can be detailed further: Quantize the discrete-time input data stream x[n] by the first quantizer 502 to get x̃[n]; Send x̃[n] through the predictive filter 504 and quantize the output data stream from the predictive filter in the second quantizer 508, which is controlled by the first quantizer 502, to get x̂[n]. This control makes sure that x̂[n] gets the same quantization step size as x̃[n]. Using the same quantization step here means that if floating-point is used, x̂[n] shall have the same exponent as x̃[n]; and calculate the quantized residual error as r[n] =x̃[n]−x̂[n] using modulo arithmetic. If floating-point is used, it is sufficient to subtract the mantissas since the exponents are the same.

Steps to be performed by the decoder, according to a possible embodiment, the steps are performed per IQ sample, and the repetition at step 4 is for the following IQ sample:

1. If the encoder did a reset for the current sample, e.g. agreed in advance to reset at the beginning of every Nth packet or signaled explicitly, then set the decoder to the same initial state as the encoder.
2. Decode the entropy encoding to get a sample of the residual.
3. Add the residual to the quantized output sample of the encoder, using modular arithmetic to get the output data stream. If floating-point is used, the exponent controls the quantization step size as in the encoder.
4. Feedback the output to the predictor 518 and repeat from step 1, for the following IQ sample.

Numerical simulations have been done to evaluate the performance of embodiments of the invention. An LTE 20 MHz DL carrier with 256-QAM modulation is sampled with 30.72 Msps. A performance comparison has been made between the embodiment of the invention using fixed-point format, i.e. no exponent and no scaling and using modulo M, and prior art open-loop as in FIG. 5, as well as prior art closed-loop LPC using the same assumptions as in [1]. LPC quantization is performed with fixed-point format using 6 to 8 bits. The result is in Table 1 Table 1, which shows the number of quantizer bits $N_q$, the average number of coded bits per sample R, and the error vector magnitude, EVM. Open-loop LPC prior art is described in "A partial decorrelation scheme for improved predictive open loop quantization with noise shaping", by Krüger et al, in Proceedings of INTERSPEECH 2005—Eurospeech, Lisbon, Portugal, Sep. 4-8, 2005 [2]. In Here performance is shown for two different values (0.5 and 1) of the control parameter a described in the prior art document. When α equals 1, the power spectral density is used to calculate the predictor coefficients (as in traditional open-loop LPC) and when α equals 0.5, the square root of the power spectral density is used to calculate the predictor coefficients. The latter gives a predictor that is predicting less accurately, which leads to higher bitrate after entropy coding, but on the other hand the noise problems of prior art open-loop LPC are reduced, which improves signal quality after the decoder. As a side note, setting α to 0 would mean disabling the prediction. To be able to compare with the results in [1]Fel! Hittar inte referenskälla., the number of bits per sample, R, has been normalized with the original sample rate despite the fact that the cyclic prefix was removed. Actual R per coded sample can be found by multiplying values in the table with 15/14. As can be seen, the invention performs almost identical to prior art closed loop. The only advantage of closed-loop LPC here is that the quantizer can use fewer bits (6 instead of 7 or 8). Prior art open loop LPC has much higher EVM for a given R, mainly due to the shaped noise property.

TABLE 1

Performance comparison between prior art and an embodiment of the invention, results shown for predictors with 4 and 6 coefficients.

| | $N_p$ = 4 coeffs | | | $N_p$ = 6 coeffs | | |
| --- | --- | --- | --- | --- | --- | --- |
| | $N_q$ (bits) | R (bits) | EVM (%) | $N_q$ (bits) | R (bits) | EVM (%) |
| Open Loop LPC [2], α = 1 | 7 | 4.39 | 3.74 | 7 | 4.49 | 3.47 |
| Open Loop LPC [2], α = 0.5 | 7 | 4.79 | 2.71 | 7 | 4.89 | 2.51 |
| Closed Loop LPC [1] | 6 | 4.39 | 1.65 | 6 | 4.47 | 1.02 |
| Embodiment | 7 | 4.39 | 1.64 | 8 | 4.50 | 1.02 |

Figure 7:
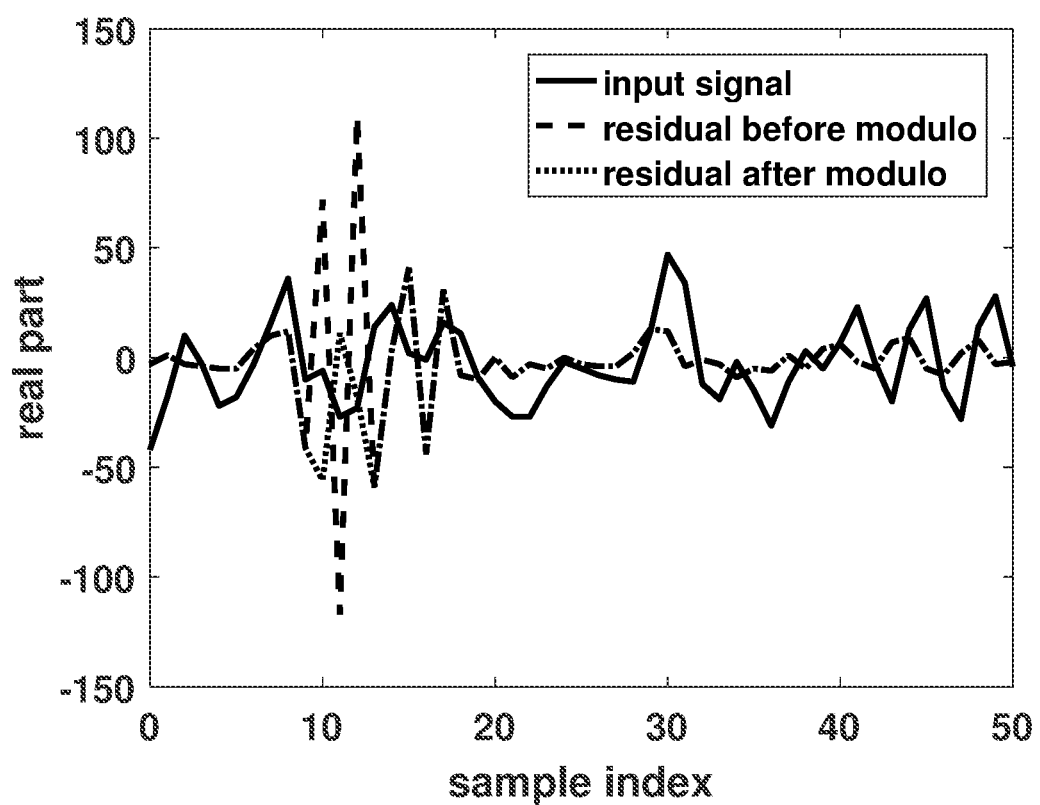
FIG. 7 is a diagram of a Cartesian coordinate system illustrating numerical simulation results for different embodiments compared to a signal of an input data stream.

FIG. 7 shows the result of a numerical evaluation for an embodiment of the invention using floating-point quantization with a 7-bit mantissa and modulo M. The modulo M operation restores the residual to within the input quantizer's range of [−64, 63]. The behavior is shown during a transient around sample index 8. In this case, the transient is due to a discontinuity in the input signal. It can be seen that the prediction residual before modulo operation grows to much larger positive and negative values than the input signal, which would normally necessitate allocating additional bits to the residual. After applying modulo operation, the residual is guaranteed to be in the range of the input quantizer. The output of the decoder will not be affected by the transient; after a corresponding modulo operation in the decoder, the output will track the input signal apart from a small quantization error caused by the first quantizer.

Further, a method is described, performed by an encoder of a communication network, for handling data streams for transmission over a transmission connection to a decoder, wherein each data stream comprises a plurality of IQ samples in turn comprising a first IQ sample and a second IQ sample. The method comprises quantizing the plurality of IQ samples by a first quantizer, and converting, by an encoder predictor, the quantized plurality of IQ samples to predictions of the plurality of IQ samples, the predictions comprising a prediction of the first IQ sample and a prediction of the second IQ sample. The method further comprises calculating on a per IQ sample level, a difference between the quantized plurality of IQ samples and the predictions of the plurality of IQ samples, so that a difference between the quantized first IQ sample and the prediction of the first IQ sample, as well as a difference between the quantized second IQ sample and the prediction of the second IQ sample are calculated, in order to create a plurality of IQ prediction errors. The method further comprises quantizing the predictions of the plurality of IQ samples before the calculating, or quantizing the plurality of IQ prediction errors after the calculating, by a second quantizer. The method further comprises encoding, after the quantizing by the second quantizer, the plurality of IQ prediction errors with fewer bits than a number of bits of the plurality of IQ prediction errors, and sending the encoded plurality of IQ prediction errors over the transmission connection to a decoder of the base station system. The embodiments described above for the methods of the encoder of the base station system may also be used in this general encoder.

Further, a method is described, performed by a decoder of a communication network, for handling data streams received over a transmission connection from an encoder, the data stream comprising a plurality of IQ samples comprising a first IQ sample and a second IQ sample. The method comprises receiving, from the encoder over the transmission connection, a plurality of encoded IQ prediction errors of the IQ samples of the data stream, comprising a first IQ prediction error and a second IQ prediction error, decoding the received plurality of encoded IQ prediction errors into more bits than a number of bits of the plurality of encoded IQ prediction errors, and converting, in a feed-back loop by a decoder predictor, an output data stream of the decoder comprising the plurality of IQ samples, to predictions of the plurality of IQ samples comprising a prediction of the first IQ sample and a prediction of the second IQ sample. The method further comprises quantizing, by a decoder quantizer, the predictions of the plurality of IQ samples, and adding the predictions of the plurality of IQ samples to the decoded plurality of IQ prediction errors on a per IQ sample level so that the prediction of the first IQ sample is added to the decoded first IQ prediction error and the prediction of the second IQ sample is added to the decoded second IQ prediction error, in order to create the plurality of IQ samples. The embodiments described above for the methods of the decoder of the base station system may also be used in this general decoder.

Further, encoders and decoders corresponding to the above respective methods are also disclosed, as well as corresponding computer programs.

Figure 8:
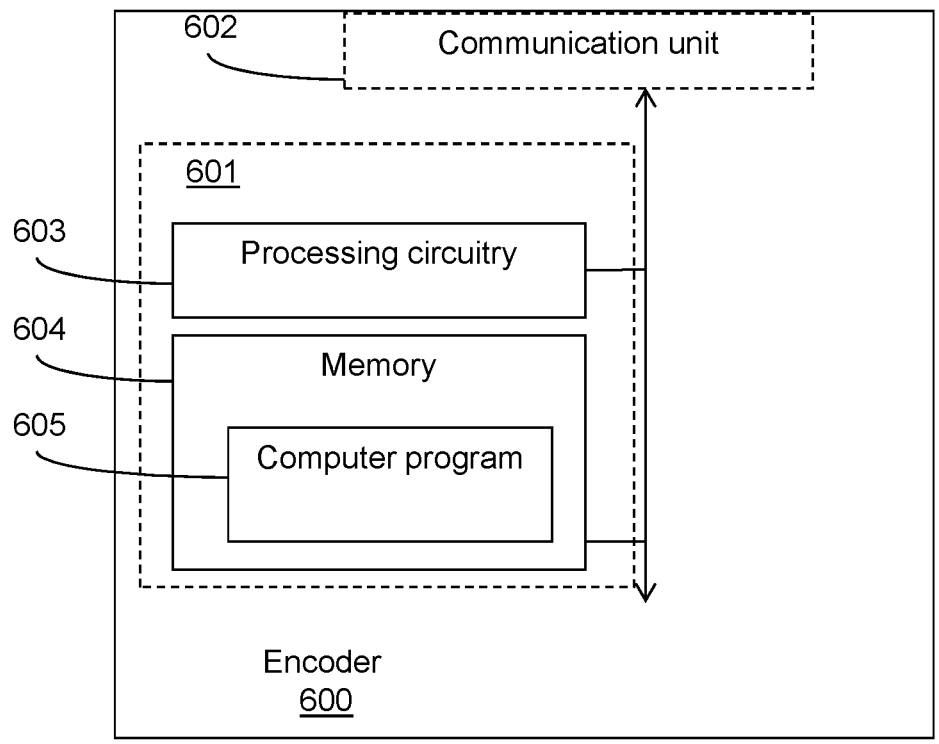
FIGS. 8-9 are block diagrams illustrating an encoder in more detail, according to further possible embodiments.

FIG. 8, in conjunction with FIG. 2, describes an encoder 600 operable in a base station system 100 of a wireless communication system, for handling a data stream for transmission over a transmission connection 165 between a remote unit 160 and a base unit 170 of the base station system. The remote unit is arranged to transmit wireless signals to, and receive from, mobile stations 180, the data stream comprising a plurality of IQ samples comprising a first IQ sample and a second IQ sample. The encoder 600 comprises a processing circuitry 603 and a memory 604. The memory contains instructions executable by said processing circuitry, whereby the encoder 600 is operative for quantizing the plurality of IQ samples by a first quantizer and converting, by an encoder predictor, the quantized plurality of IQ samples to predictions of the plurality of IQ samples, the predictions comprising a prediction of the first IQ sample and a prediction of the second IQ sample. The encoder is further operative for calculating, on a per IQ sample level, a difference between the quantized plurality of IQ samples and the predictions of the plurality of IQ samples, so that a difference between the quantized first IQ sample and the prediction of the first IQ sample, as well as a difference between the quantized second IQ sample and the prediction of the second IQ sample are calculated, in order to create a plurality of IQ prediction errors. The encoder is further operative for quantizing the predictions of the plurality of IQ samples before the calculating, or quantizing the plurality of IQ prediction errors after the calculating, by a second quantizer. The encoder is further operative for encoding, after the quantizing by the second quantizer, the plurality of IQ prediction errors with fewer bits than a number of bits of the plurality of IQ prediction errors, and sending the encoded plurality of IQ prediction errors over the transmission connection 165 to a decoder of the base station system 100.

According to an embodiment, when any of the IQ prediction errors is outside a predetermined range, the encoder is operative for reducing the any IQ prediction error until the any IQ prediction error is within the predetermined range.

According to another embodiment, the encoder is operative for performing the reducing by reducing the any IQ prediction error modulo M, where M is the number of quantization levels of the first quantizer, which number of quantization levels is related to the predetermined range.

According to another embodiment, the encoder is further operative for, when transmission of a new packet of the data stream is to begin, resetting a filter state of the encoder predictor to a predetermined state.

According to another embodiment, the encoder is operative for performing the quantizing in the first quantizer as well as in the second quantizer by quantizing the first IQ sample to a basic value added with a first IQ-sample specific value, and by quantizing the second IQ sample to the basic value added with a second IQ-sample specific value.

According to another embodiment, the encoder is further operative for sending the basic value of the first quantizer over the transmission connection 165 to the decoder.

According to another embodiment, the encoder is further operative for de-quantizing the quantized plurality of IQ samples, quantized by the first quantizer, and operative for performing the converting on the de-quantized quantized plurality of IQ samples.

According to other embodiments, the first quantizer and the second quantizer have the same number of quantization levels and/or the same quantization step size.

According to other embodiments, the encoder 600 may further comprise a communication unit 602, which may be considered to comprise conventional means for communication with a decoder 800 over a fronthaul connection 165, such as a transceiver. The instructions executable by said processing circuitry 603 may be arranged as a computer program 605 stored e.g. in said memory 604. The processing circuitry 603 and the memory 604 may be arranged in a sub-arrangement 601. The sub-arrangement 601 may be a micro-processor and adequate software and storage therefore, a Programmable Logic Device, PLD, or other electronic component(s)/processing circuit(s) configured to perform the methods mentioned above. The processing circuitry 603 may comprise one or more programmable processor, application-specific integrated circuits, field programmable gate arrays or combinations of these adapted to execute instructions.

The computer program 605 may be arranged such that when its instructions are run in the processing circuitry, they cause the encoder 600 to perform the steps described in any of the described embodiments of the encoder 600. The computer program 605 may be carried by a computer program product connectable to the processing circuitry 603. The computer program product may be the memory 604, or at least arranged in the memory. The memory 604 may be realized as for example a RAM (Random-access memory), ROM (Read-Only Memory) or an EEPROM (Electrical Erasable Programmable ROM). Further, the computer program 605 may be carried by a separate computer-readable medium, such as a CD, DVD or flash memory, from which the program could be downloaded into the memory 604. Alternatively, the computer program may be stored on a server or any other entity connected to the wireless communication network 100 to which the encoder 600 has access via the communication unit 602. The computer program 605 may then be downloaded from the server into the memory 604.

Figure 9:
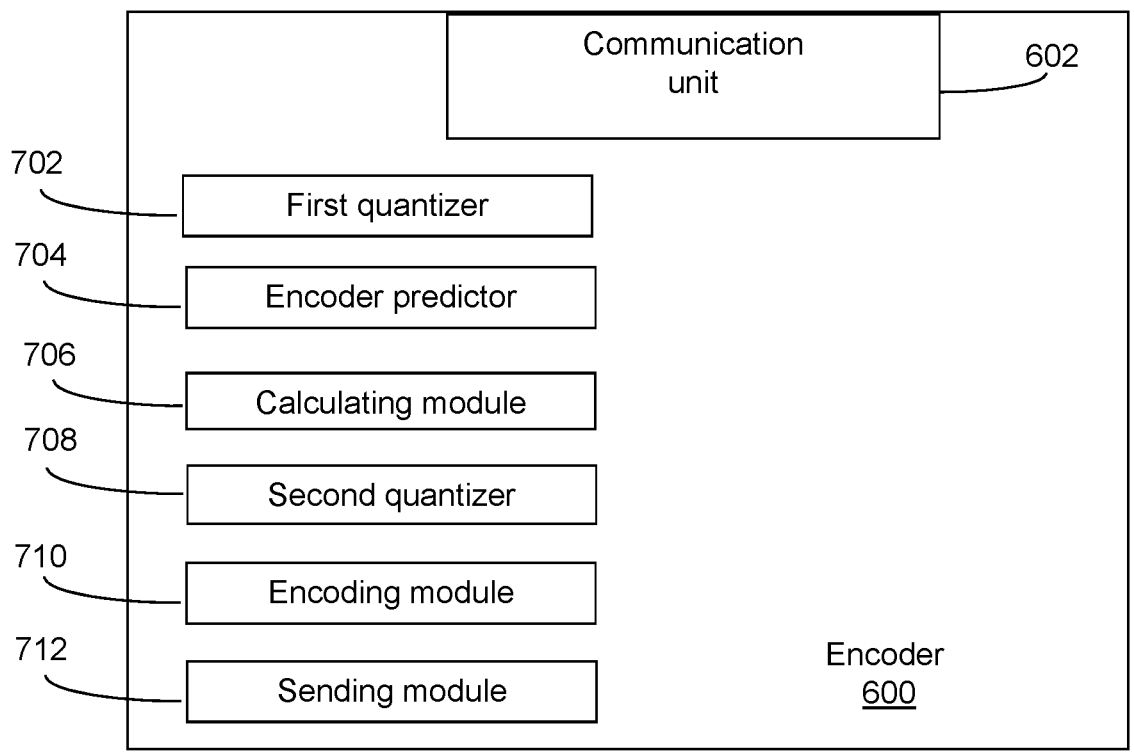

FIG. 9, in conjunction with FIG. 2, describes another embodiment of an encoder 600 operable in a base station system 100 of a wireless communication system, for handling a data stream for transmission over a transmission connection 165 between a remote unit 160 and a base unit 170 of the base station system. The remote unit is arranged to transmit wireless signals to, and receive from, mobile stations 180. The data stream comprises a plurality of IQ samples comprising a first IQ sample and a second IQ sample. The encoder 600 comprises a first quantizer 702 for quantizing the plurality of IQ samples and an encoder predictor 70) for converting the quantized plurality of IQ samples to predictions of the plurality of IQ samples, the predictions comprising a prediction of the first IQ sample and a prediction of the second IQ sample. The encoder 600 further comprises a calculating module 706 for calculating, on a per IQ sample level, a difference between the quantized plurality of IQ samples and the predictions of the plurality of IQ samples, so that a difference between the quantized first IQ sample and the prediction of the first IQ sample, as well as a difference between the quantized second IQ sample and the prediction of the second IQ sample are calculated, in order to create a plurality of IQ prediction errors. The encoder 600 further comprises a second quantizer 708 for quantizing the predictions of the plurality of IQ samples before the calculating, or quantizing the plurality of IQ prediction errors after the calculating, an encoding module 710 for encoding, after the quantizing by the second quantizer, the plurality of IQ prediction errors with fewer bits than a number of bits of the plurality of IQ prediction errors, and a sending module 712 for sending the encoded plurality of IQ prediction errors over the transmission connection 165 to a decoder of the base station system. The encoder 600 may further comprise a communication unit 602 similar to the communication unit described in FIG. 8. In an embodiment, the modules of FIG. 9 are implemented as a computer program running on a processing circuitry, such as the processing circuitry 603 shown in FIG. 8.

Figure 10:
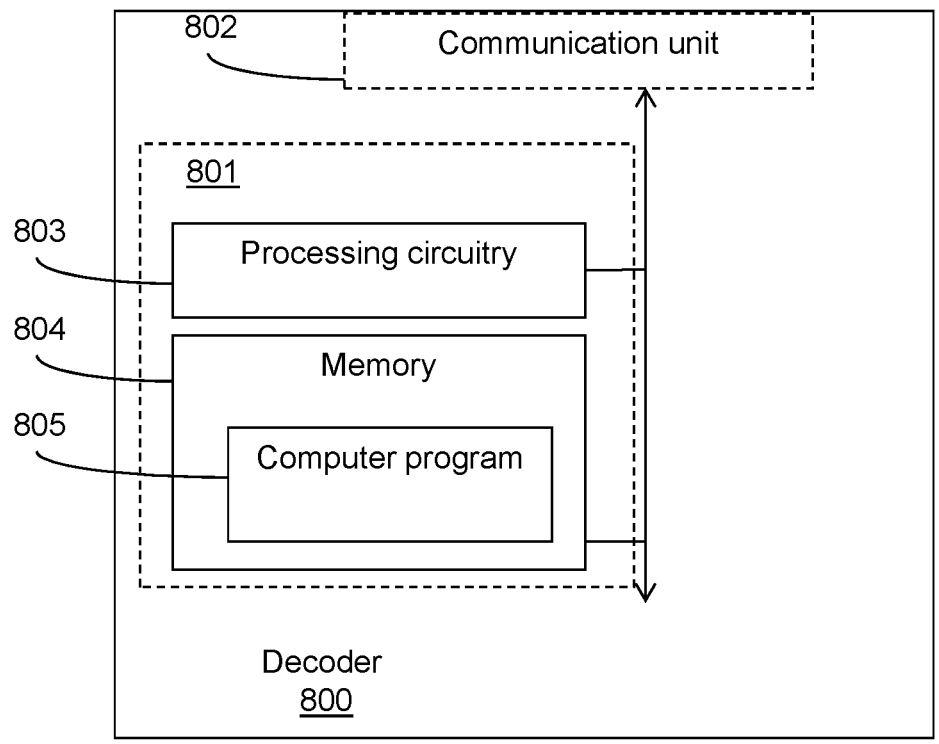
FIGS. 10-11 are block diagrams illustrating a decoder in more detail, according to further possible embodiments.

FIG. 10, in conjunction with FIG. 2, shows a decoder 800 operable in a base station system 100 of a wireless communication system, for handling a data stream received over a transmission connection 165 between a remote unit 160 and a base unit 170 of the base station system. The remote unit is arranged to transmit wireless signals to, and receive from, mobile stations 180. The data stream comprises a plurality of IQ samples comprising a first IQ sample and a second IQ sample. The decoder 800 comprises a processing circuitry 803 and a memory 804. The memory contains instructions executable by said processing circuitry, whereby the decoder 800 is operative for receiving, from an encoder of the base station system 100 over the transmission connection 165, a plurality of encoded IQ prediction errors of the IQ samples of the data stream, comprising a first IQ prediction error and a second IQ prediction error, and decoding the received plurality of encoded IQ prediction errors into more bits than a number of bits of the plurality of encoded IQ prediction errors. The decoder 800 is further operative for converting, in a feed-back loop by a decoder predictor, an output data stream of the decoder comprising the plurality of IQ samples, to predictions of the plurality of IQ samples comprising a prediction of the first IQ sample and a prediction of the second IQ sample. The decoder 800 is further operative for adding the predictions of the plurality of IQ samples to the decoded plurality of IQ prediction errors on a per IQ sample level so that the prediction of the first IQ sample is added to the decoded first IQ prediction error and the prediction of the second IQ sample is added to the decoded second IQ prediction error, in order to create the plurality of IQ samples. The decoder is further operative for quantizing, by a decoder quantizer, the predictions of the plurality of IQ samples before the adding, or for quantizing the plurality of IQ samples after the adding.

According to an embodiment, the decoder 800 is operative for performing the quantizing by quantizing the predictions of the plurality of IQ samples or the plurality of IQ samples using a same number of quantization levels and quantization step size as used at a quantization performed by the encoder.

According to another embodiment, the decoder 800 is further operative for, when any of the plurality of quantized IQ samples is outside a predetermined range, reducing the any of the plurality of IQ samples until the any quantized IQ sample is within the predetermined range.

According to another embodiment, the decoder 800 is operative for performing the reducing by reducing the any of the plurality of IQ prediction errors modulo M, where M is a number of quantization levels of the decoder quantizer, which number of quantization levels is related to the predetermined range.

According to another embodiment, the decoder is further operative for, when receiving information from the encoder that transmission of a new packet is to begin, resetting a filter state of the decoder predictor to a predetermined state.

According to another embodiment, the decoder 800 is operative for performing the quantizing by quantizing the prediction of the first IQ sample or the first IQ sample to a basic value added with a first IQ-sample specific value, and by quantizing the prediction of the second IQ sample or the second IQ sample to the basic value added with a second IQ-sample specific value.

According to another embodiment, the decoder is further operative for de-quantizing the plurality of IQ samples.

According to other embodiments, the decoder 800 may further comprise a communication unit 802, which may be considered to comprise conventional means for communication with an encoder 600 over a fronthaul connection 165, such as a transceiver. The instructions executable by said processing circuitry 803 may be arranged as a computer program 805 stored e.g. in said memory 804. The processing circuitry 803 and the memory 804 may be arranged in a sub-arrangement 801. The sub-arrangement 801 may be a micro-processor and adequate software and storage therefore, a Programmable Logic Device, PLD, or other electronic component(s)/processing circuit(s) configured to perform the methods mentioned above. The processing circuitry 803 may comprise one or more programmable processor, application-specific integrated circuits, field programmable gate arrays or combinations of these adapted to execute instructions.

The computer program 805 may be arranged such that when its instructions are run in the processing circuitry, they cause the decoder 800 to perform the steps described in any of the described embodiments of the decoder 800. The computer program 805 may be carried by a computer program product connectable to the processing circuitry 803. The computer program product may be the memory 804, or at least arranged in the memory. The memory 804 may be realized as for example a RAM (Random-access memory), ROM (Read-Only Memory) or an EEPROM (Electrical Erasable Programmable ROM). Further, the computer program 805 may be carried by a separate computer-readable medium, such as a CD, DVD or flash memory, from which the program could be downloaded into the memory 804. Alternatively, the computer program may be stored on a server or any other entity connected to the wireless communication network 100 to which the decoder 800 has access via the communication unit 802. The computer program 805 may then be downloaded from the server into the memory 804.

Figure 11:
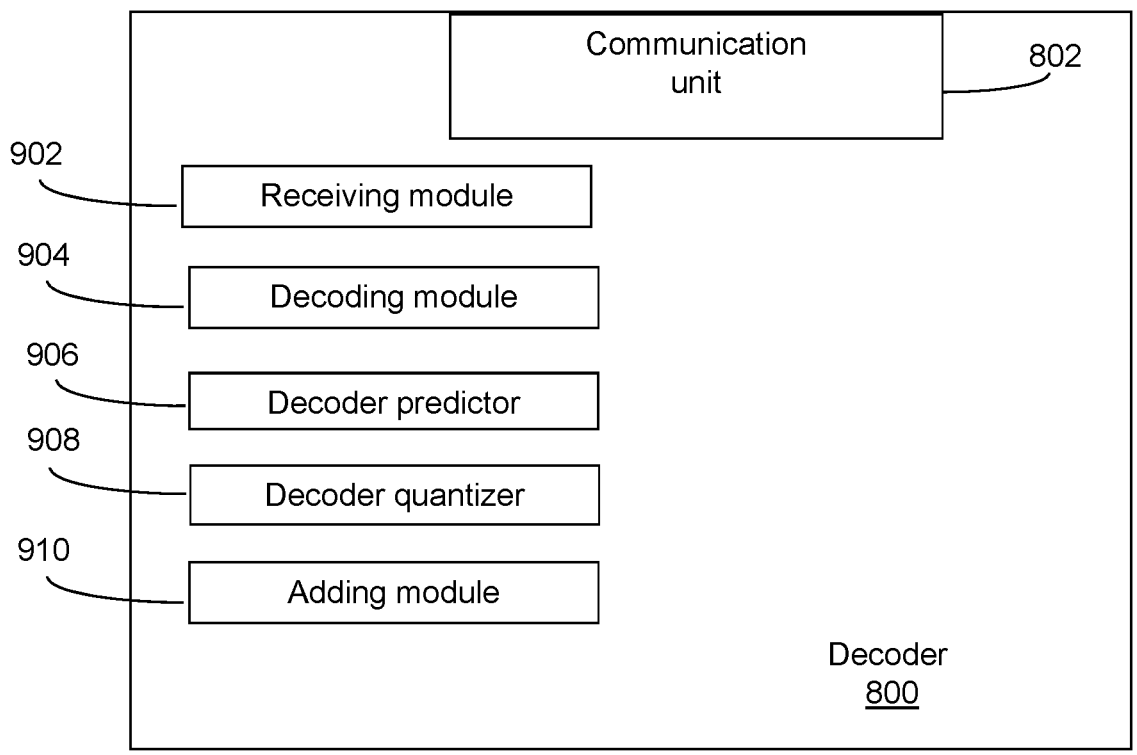

FIG. 11, in conjunction with FIG. 2, shows an alternative embodiment of a decoder 800 operable in a base station system 100 of a wireless communication system, for handling a data stream received over a transmission connection 165 between a remote unit 160 and a base unit 170 of the base station system. The remote unit is arranged to transmit wireless signals to, and receive from, mobile stations 180. The data stream comprises a plurality of IQ samples comprising a first IQ sample and a second IQ sample. The decoder 800 comprises a receiving module 902 for receiving, from an encoder of the base station system 100 over the transmission connection 165, a plurality of encoded IQ prediction errors of the IQ samples of the data stream, comprising a first IQ prediction error and a second IQ prediction error, and a decoding module 904 for decoding the received plurality of encoded IQ prediction errors into more bits than a number of bits of the plurality of encoded IQ prediction errors. The decoder 800 further comprises a decoder predictor 906 for converting, in a feed-back loop, an output data stream of the decoder comprising the plurality of IQ samples, to predictions of the plurality of IQ samples comprising a prediction of the first IQ sample and a prediction of the second IQ sample, and an adding module 910 for adding the predictions of the plurality of IQ samples to the decoded plurality of IQ prediction errors on a per IQ sample level so that the prediction of the first IQ sample is added to the decoded first IQ prediction error and the prediction of the second IQ sample is added to the decoded second IQ prediction error, in order to create the plurality of IQ samples. The decoder further comprises a decoder quantizer 908 for quantizing the predictions of the plurality of IQ samples before the adding in the adding module, or for quantizing the plurality of IQ samples after the adding in the adding module.

Although the description above contains a plurality of specificities, these should not be construed as limiting the scope of the concept described herein but as merely providing illustrations of some exemplifying embodiments of the described concept. It will be appreciated that the scope of the presently described concept fully encompasses other embodiments which may become obvious to those skilled in the art, and that the scope of the presently described concept is accordingly not to be limited. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for an apparatus or method to address each and every problem sought to be solved by the presently described concept, for it to be encompassed hereby. In the exemplary figures, a broken line generally signifies that the feature within the broken line is optional.

The invention claimed is:

1. A method performed by an encoder of a base station system of a wireless communication network, for handling a data stream for transmission over a transmission connection between a remote unit and a base unit of the base station system, the remote unit being arranged to transmit wireless signals to, and receive from, mobile stations, the data stream comprising a plurality of IQ samples comprising a first IQ sample and a second IQ sample, the method comprising:
quantizing the plurality of IQ samples by a first quantizer;
converting, by an encoder predictor, the quantized plurality of IQ samples to predictions of the plurality of IQ samples, the predictions comprising a prediction of the first IQ sample and a prediction of the second IQ sample;
calculating on a per IQ sample level, a difference between the quantized plurality of IQ samples and the predictions of the plurality of IQ samples, so that a difference between a quantized first IQ sample and the prediction of the first IQ sample, and a difference between a quantized second IQ sample and the prediction of the second IQ sample are calculated, in order to create a plurality of IQ prediction errors;
quantizing the predictions of the plurality of IQ samples before the calculating, or quantizing the plurality of IQ prediction errors after the calculating, by a second quantizer;
encoding, after the quantizing by the second quantizer, the plurality of IQ prediction errors with fewer bits than a number of bits of the plurality of IQ prediction errors, and
sending the encoded plurality of IQ prediction errors over the transmission connection to a decoder of the base station system.

2. The method according to claim 1, wherein the first quantizer and the second quantizer have the same number of quantization levels.

3. The method according to claim 1, wherein the first quantizer and the second quantizer have the same quantization step size.

4. The method according to claim 1, wherein when any of the IQ prediction errors is outside a predetermined range, reducing the any IQ prediction error until the any IQ prediction error is within the predetermined range.

5. The method according to claim 4, wherein the reducing comprises reducing the any IQ prediction error to modulo M, where M is a number of quantization levels of the first quantizer, which number of quantization levels is related to the predetermined range.

6. The method according to claim 1, further comprising, when transmission of a new packet of the data stream is to begin, resetting a filter state of the encoder predictor to a predetermined state.

7. The method according to claim 1, further comprising, in the first quantizer and in the second quantizer, the quantizing is performed by quantizing the first IQ sample to a basic value added with a first IQ-sample specific value, and quantizing the second IQ sample to the basic value added with a second IQ-sample specific value.

8. The method according to claim 7, further comprising sending the basic value of the first quantizer over the transmission connection to the decoder.

9. The method according to claim 1, further comprising:
de-quantizing the quantized plurality of IQ samples, quantized by the first quantizer, and wherein the converting is performed on the de-quantized quantized plurality of IQ samples.

10. A method performed by a decoder of a base station system of a wireless communication network, for handling a data stream received over a transmission connection between a remote unit and a base unit of the base station system, the remote unit being arranged to transmit wireless signals to, and receive from, mobile stations, the data stream comprising a plurality of IQ samples comprising a first IQ sample and a second IQ sample, the method comprising:
receiving, from an encoder of the base station system over the transmission connection, a plurality of encoded IQ prediction errors of the IQ samples of the data stream, comprising a first IQ prediction error and a second IQ prediction error;

decoding the received plurality of encoded IQ prediction errors into more bits than a number of bits of the plurality of encoded IQ prediction errors;

converting, in a feed-back loop by a decoder predictor, an output data stream of the decoder comprising the plurality of IQ samples, to predictions of the plurality of IQ samples comprising a prediction of the first IQ sample and a prediction of the second IQ sample;

adding the predictions of the plurality of IQ samples to the decoded plurality of IQ prediction errors on a per IQ sample level so that the prediction of the first IQ sample is added to a decoded first IQ prediction error and the prediction of the second IQ sample is added to a decoded second IQ prediction error, in order to create the plurality of IQ samples, and quantizing, by a decoder quantizer, the predictions of the plurality of IQ samples before the adding, or quantizing the plurality of IQ samples after the adding.

11. The method according to claim 10, wherein the quantizing comprises quantizing the predictions of the plurality of IQ samples or quantizing the plurality of IQ samples using a same number of quantization levels and quantization step size as used at a quantization performed by the encoder.

12. The method according to claim 10, wherein when any of the plurality of quantized IQ samples is outside a predetermined range, reducing the any of the plurality of IQ samples until the any quantized IQ sample is within the predetermined range.

13. The method according to claim 12, wherein the reducing comprises reducing the any of the plurality of IQ prediction errors to modulo M, where M is a number of quantization levels of the decoder quantizer, which number of quantization levels is related to the predetermined range.

14. The method according to claim 10, when receiving information from the encoder that transmission of a new packet is to begin, resetting a filter state of the decoder predictor to a predetermined state.

15. The method according to claim 10, wherein the quantizing is performed by quantizing the prediction of the first IQ sample or the first IQ sample to a basic value added with a first IQ-sample specific value, and quantizing the prediction of the second IQ sample or the second IQ sample to the basic value added with a second IQ-sample specific value.

16. The method according to claim 10, further comprising:
de-quantizing the plurality of IQ samples.

17. A non-transitory computer-readable storage medium comprising instructions which, when executed by at least one processing circuitry of an encoder of a base station system for handling a data stream for transmission over a transmission connection between a remote unit and a base unit of the base station system, the data stream comprising a plurality of IQ samples comprising a first IQ sample and a second IQ sample, are capable of causing the encoder to perform operations comprising:

quantizing the plurality of IQ samples by a first quantizer;

converting, by an encoder predictor, the quantized plurality of IQ samples to predictions of the plurality of IQ samples, the predictions comprising a prediction of the first IQ sample and a prediction of the second IQ sample;

calculating, on a per IQ sample level, a difference between the quantized plurality of IQ samples and the predictions of the plurality of IQ samples, so that a difference between a quantized first IQ sample and the prediction of the first IQ sample, and a difference between a quantized second IQ sample and the prediction of the second IQ sample are calculated, in order to create a plurality of IQ prediction errors;

quantizing the predictions of the plurality of IQ samples before the calculating, or quantizing the plurality of IQ prediction errors after the calculating, by a second quantizer;

encoding, after the quantizing by the second quantizer, the plurality of IQ prediction errors with fewer bits than a number of bits of the plurality of IQ prediction errors, and sending the encoded plurality of IQ prediction errors over the transmission connection to a decoder of the base station system.

18. A non-transitory computer-readable storage medium according to claim 17, wherein the instructions are further capable of causing, when transmission of a new packet of the data stream is to begin, resetting a filter state of the encoder predictor to a predetermined state.

19. A non-transitory computer-readable storage medium comprising instructions which, when executed by at least one processing circuitry of a decoder of a base station system, configured for handling a data stream received over a transmission connection between a remote unit and a base unit of the base station system, the remote unit being arranged to transmit wireless signals to, and receive from, mobile stations, the data stream comprising a plurality of IQ samples comprising a first IQ sample and a second IQ sample, are capable of causing the decoder to perform operations comprising:

receiving, from an encoder of the base station system over the transmission connection, a plurality of encoded IQ prediction errors of the IQ samples of the data stream, comprising a first IQ prediction error and a second IQ prediction error;

decoding the received plurality of encoded IQ prediction errors into more bits than a number of bits of the plurality of encoded IQ prediction errors;

converting, in a feed-back loop by a decoder predictor, an output data stream of the decoder comprising the plurality of IQ samples, to predictions of the plurality of IQ samples comprising a prediction of the first IQ sample and a prediction of the second IQ sample;

adding the predictions of the plurality of IQ samples to the decoded plurality of IQ prediction errors on a per IQ sample level so that the prediction of the first IQ sample is added to a decoded first IQ prediction error and the prediction of the second IQ sample is added to a decoded second IQ prediction error, in order to create the plurality of IQ samples, and quantizing, by a decoder quantizer, the predictions of the plurality of IQ samples before the adding, or quantizing the plurality of IQ samples after the adding.

20. A non-transitory computer-readable storage medium according to claim 19, wherein the instructions are further capable of causing, when any of the plurality of quantized IQ samples is outside a predetermined range, reducing the any of the plurality of IQ samples until the any quantized IQ sample is within the predetermined range.

* * * * *